US009488912B2

(12) United States Patent
Mukai et al.

(10) Patent No.: US 9,488,912 B2
(45) Date of Patent: Nov. 8, 2016

(54) METHOD OF FORMING PROTECTIVE FILM FOR TOUCH PANEL ELECTRODE, PHOTOSENSITIVE RESIN COMPOSITION AND PHOTOSENSITIVE ELEMENT, AND METHOD OF MANUFACTURING TOUCH PANEL

(71) Applicant: HITACHI CHEMICAL COMPANY, LTD., Chiyoda-ku, Tokyo (JP)

(72) Inventors: Ikuo Mukai, Hitachi (JP); Yasuharu Murakami, Hitachi (JP); Naoki Sasahara, Hitachi (JP); Hiroshi Yamazaki, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/362,743

(22) PCT Filed: Dec. 4, 2012

(86) PCT No.: PCT/JP2012/081362
§ 371 (c)(1),
(2) Date: Jun. 4, 2014

(87) PCT Pub. No.: WO2013/084873
PCT Pub. Date: Jun. 13, 2013

(65) Prior Publication Data
US 2014/0377704 A1 Dec. 25, 2014

(30) Foreign Application Priority Data
Dec. 5, 2011 (WO) .................. PCT/JP2011/078107

(51) Int. Cl.
*G03F 7/20* (2006.01)
*G03F 7/033* (2006.01)
(Continued)

(52) U.S. Cl.
CPC ............. *G03F 7/033* (2013.01); *G03F 7/0045* (2013.01); *G03F 7/20* (2013.01); *G06F 3/044* (2013.01); *G06F 2203/04103* (2013.01)

(58) Field of Classification Search
CPC .................. G06F 3/041; G06F 3/044; G06F 2003/04103; G03F 7/033; G03F 7/20; G03F 7/0045
USPC ............................................... 430/319, 281.1
See application file for complete search history.

(56) References Cited

U.S. PATENT DOCUMENTS 8,168,369 B2   5/2012  Cho et al.
8,198,008 B2   6/2012  Miyasaka et al.
(Continued)

FOREIGN PATENT DOCUMENTS

CN   1707358      12/2005
CN   1828411 A    9/2006
(Continued)

OTHER PUBLICATIONS

Computer-generated translation of WO 2011/129312 A1 (Oct. 2011).*
(Continued)

*Primary Examiner* — John A McPherson
(74) *Attorney, Agent, or Firm* — Fitch, Even, Tabin & Flannery, LLP

(57) ABSTRACT

In the method for forming a protective coat on an electrode for a touch panel according to the invention, a photosensitive layer comprising a photosensitive resin composition containing a binder polymer having a carboxyl group and an acid value of 30 to 120 mgKOH/g, a photopolymerizable compound having at least three ethylenic unsaturated groups, and a photopolymerization initiator, is formed on a base material having an electrode for a touch panel, prescribed sections of the photosensitive layer are cured by irradiation with active light rays and then the sections other than the prescribed sections are removed, to form a protective coat comprising the cured sections of the photosensitive resin composition covering all or a portion of the electrode.

13 Claims, 5 Drawing Sheets

(51) Int. Cl.
*G03F 7/004* (2006.01)
*G06F 3/044* (2006.01)

(56) References Cited

U.S. PATENT DOCUMENTS

| | | |
|---|---|---|
| 8,486,591 B2 | 7/2013 | Jeong et al. |
| 8,871,430 B2 | 10/2014 | Cho et al. |
| 9,052,587 B2 | 6/2015 | Yamazaki et al. |
| 2010/0261815 A1 | 10/2010 | Cho et al. |
| 2013/0188270 A1 | 7/2013 | Nishimae et al. |

FOREIGN PATENT DOCUMENTS

| | | |
|---|---|---|
| CN | 1940724 A | 4/2007 |
| CN | 101185028 A | 5/2008 |
| CN | 101609256 A | 12/2009 |
| CN | 101639627 A | 2/2010 |
| CN | 101918397 A | 12/2010 |
| CN | 102096532 A | 6/2011 |
| CN | 102124529 A | 7/2011 |
| CN | 102214024 A | 10/2011 |
| CN | 102576581 A | 7/2012 |
| CN | 102576582 A | 7/2012 |
| EP | 2 450 915 A1 | 5/2012 |
| JP | S63-113585 A | 5/1988 |
| JP | 3-281622 | 12/1991 |
| JP | 7-253666 | 10/1995 |
| JP | 10-105335 | 4/1998 |
| JP | 11-133617 | 5/1999 |
| JP | 2001-162757 A | 6/2001 |
| JP | 2003-248319 A | 9/2003 |
| JP | 2005-039097 A | 2/2005 |
| JP | 2005-099647 | 4/2005 |
| JP | 2006-23716 | 1/2006 |
| JP | 2006-65073 A | 3/2006 |
| JP | 2006-85053 A | 3/2006 |
| JP | 2006-243464 A | 9/2006 |
| JP | 2007-86565 A | 4/2007 |
| JP | 2007-100074 | 4/2007 |
| JP | 2008-77067 A | 4/2008 |
| JP | 2008-127545 A | 6/2008 |
| JP | 2008-165222 | 7/2008 |
| JP | 2008-233778 A | 10/2008 |
| JP | 2009-048170 A | 3/2009 |
| JP | 2009-048187 A | 3/2009 |
| JP | 2009-073022 A | 4/2009 |
| JP | 2009128759 A | 6/2009 |
| JP | 2009-258652 A | 11/2009 |
| JP | 2010-000434 A | 1/2010 |
| JP | 2010-027033 | 2/2010 |
| JP | 2010049029 A | 3/2010 |
| JP | 2010-85929 A | 4/2010 |
| JP | 2010-152302 A | 7/2010 |
| JP | 2010-204532 | 9/2010 |
| JP | 2011-028594 | 2/2011 |
| JP | 2011-39165 | 2/2011 |
| JP | 2011-60146 A | 3/2011 |
| JP | 2011-65393 A | 3/2011 |
| JP | 2011-65394 A | 3/2011 |
| JP | 4737348 B2 | 7/2011 |
| JP | 2011-164886 A | 8/2011 |
| JP | 2011-186208 A | 9/2011 |
| JP | 2011-227136 | 11/2011 |
| JP | 2011-227467 | 11/2011 |
| JP | 2011-232584 | 11/2011 |
| JP | 2011-237736 A | 11/2011 |
| JP | 4968410 B2 | 7/2012 |
| JP | 2012-215837 | 11/2012 |
| JP | 2013-200577 A | 10/2013 |
| JP | 5304968 B1 | 10/2013 |
| JP | 5304971 B1 | 10/2013 |
| JP | 2013-238837 | 11/2013 |
| KR | 10-2002-0091211 | 12/2002 |
| KR | 10-2004-0086310 A | 10/2004 |
| KR | 10-2007-0031457 A | 3/2007 |
| KR | 10-2007-0073788 A | 7/2007 |
| KR | 10-2009-0049541 A | 5/2009 |
| KR | 10-2009-0101848 A | 9/2009 |
| KR | 10-2009-0132499 A | 12/2009 |
| KR | 10-2011-0002609 A | 1/2011 |
| KR | 10-2011-0054369 A | 5/2011 |
| KR | 10-2011-0108268 A | 10/2011 |
| KR | 10-2012-0036870 | 4/2012 |
| KR | 10-2012-0052408 | 5/2012 |
| TW | 1333499 | 8/2007 |
| TW | 201005436 A | 2/2010 |
| TW | 201033731 A | 9/2010 |
| TW | 201039053 | 11/2010 |
| TW | 201042373 | 12/2010 |
| TW | 201100960 A | 1/2011 |
| TW | 201211677 A | 3/2012 |
| TW | 201214033 A | 4/2012 |
| TW | 201337677 A | 9/2013 |
| TW | I512399 B | 12/2015 |
| WO | WO 2011/001961 A1 | 1/2011 |
| WO | WO 2011/046076 A1 | 4/2011 |
| WO | WO 2011/129210 | 10/2011 |
| WO | WO 2011/129312 | 10/2011 |

OTHER PUBLICATIONS

Computer-generated translation of WO 2011/129210 A1 (Oct. 2011).*
Computer-generated translation of JP 2011-039165 A (Feb. 2011).*
Japanese Office Action, Japanese Patent Application No. P2013-123511, Jan. 13, 2015.
TW Office Action of Appln. No. 101145692 dated May 5, 2015.
TW office action of Appln. No. 101145693 dated May 21, 2015.
Communication mailed Jan. 17, 2012, in connection with PCT International Application No. PCT/JP2011/078107, 1 page.
Communication mailed Mar. 5, 2013, in connection with PCT International Application No. PCT/JP2012/081361, 1 page.
Communication mailed Mar. 12, 2013, in connection with PCT International Application No. PCT/JP2012/081365, 1 page.
Communication mailed Mar. 12, 2013, in connection with PCT International Application No. PCT/JP2012/081380, 1 page.
Communication mailed Mar. 5, 2013, in connection with PCT International Application No. PCT/JP2012/081383, 1 page.
Communication mailed Mar. 5, 2013, in connection with PCT International Application No. PCT/JP2012/081377, 1 page.
Communication mailed Jan. 17, 2012, in connection with PCT International Application No. PCT/JP2011/078108, 1 page.
Communication mailed Jan. 17, 2012, in connection with PCT International Application No. PCT/JP2011/078104, 1 page.
Communication mailed Mar. 5, 2013, in connection with PCT International Application No. PCT/JP2012/081362, 1 page.
Communication mailed Feb. 25, 2014, in connection with PCT International Application No. PCT/JP2012/081377, 5 pages.
Communication mailed Feb. 21, 2014, in connection with PCT International Application No. PCT/JP2012/081362, 5 pages.
Communication mailed Jun. 19, 2014, in connection with PCT International Application No. PCT/JP2012/081365, 5 pages.
Communication mailed Jun. 19, 2014, in connection with PCT International Application No. PCT/JP2012/081361, 6 pages.
Communication mailed Jun. 19, 2014, in connection with PCT International Application No. PCT/JP2012/081362, 5 pages.
Communication mailed Jun. 19, 2014, in connection with PCT International Application No. PCT/JP2011/078108, 5 pages.
Communication mailed Jun. 19, 2014, in connection with PCT International Application No. PCT/JP2011/078104, 6 pages.
Communication mailed Jun. 19, 2014, in connection with PCT International Application No. PCT/JP2011/078107, 5 pages.
Communication mailed Jun. 19, 2014, in connection with PCT International Application No. PCT/JP2012/081380, 5 pages.
Communication mailed Jun. 19, 2014, in connection with PCT International Application No. PCT/JP2012/081383, 5 pages.
JP Office Action of Appln. No. 2013-123511 dated Jul. 7, 2015.
Communication mailed Jun. 19, 2014, in connection with PCT International Application No. PCT/JP2012/081377, 5 pages.

(56) References Cited

OTHER PUBLICATIONS

Office Action of KR Appln. No. 10-2014-7016029 dated Aug. 3, 2015.
Office Action of KR Appln. No. 10-2014-7016027 dated Aug. 3, 2015.
Communication mailed Oct. 14, 2014, in connection with Japanese Application No. 2013-123511, 6 pages.
English language translation of communication mailed Oct. 14, 2014, in connection with Japanese Application No. 2013-123511, 7 pages.
Japanese Office Action, Japanese Patent Application No. P2013-548239, Mar. 23, 2015.
TW Office Action of Appln. No. 101145683 dated May 5, 2015.
U.S. Office Action of U.S. Appl. No. 14/362,726 dated Jul. 1, 2015 in English.
Office Action in counterpart TW 104133673 dated Mar. 28, 2016.
Office Action in JP counterpart Appln. No. P2015-081741 dated Jan. 19, 2016.
Office Action in counterpart CN Appln. No. 2012-80059872.4 dated Jan. 21, 2016.
Office Action in counterpart Tawain Appln. No. 101145696 dated Feb. 25, 2016.
Office Action in counterpart Korean Appln. No. 10-2014-7016026 dated Apr. 19, 2016.
Office Action in counterpart CN Patent Application No. 201280059906.X dated Mar. 22, 2016.
Notice of Allowance of counterpart Korean Appln. No. 10-2014-7016028 dated Dec. 18, 2015.
Office Action of counterpart CN Appln. No. 201280059836.8 dated Dec. 28, 2015.
Office action of counterpart Korean Appln. No. 10-2014-7016024 dated Jan. 14, 2016.
Office Action of in counterpart TW Appln. 104125481 dated Apr. 26, 2016.
Office Action in counterpart KR Appln. No. 10-2014-7016025 dated Jun. 17, 2016.
Office Action in counterpart KR Appln. No. 10-2014-7016027 dated Jun. 17, 2016.
Office Action in counterpart TW Appln. 104135790 dated Jun. 8, 2016.
Office Action in counterpart TW Appln. No. 104138855 dated Jun. 13, 2016.
Office Action in counterpart CN Appln. No. 201280059906.X dated Jul. 15, 2016.
Notification of Information Provision mailed Aug. 9, 2016, for Japanese Application No. 2015-081741.
Office Action mailed Aug. 12, 2016, for Korean Application No. 10-2014-7016029.
Office Action mailed Aug. 16, 2016, for Japanese Application No. 2013-123513.
Office Action of counterpart JP Appln. No. P2015-081741 dated Aug. 30, 2016.

\* cited by examiner (a)

(b)

(c)

(a)

(b)

METHOD OF FORMING PROTECTIVE FILM FOR TOUCH PANEL ELECTRODE, PHOTOSENSITIVE RESIN COMPOSITION AND PHOTOSENSITIVE ELEMENT, AND METHOD OF MANUFACTURING TOUCH PANEL

TECHNICAL FIELD

The present invention relates to a method for forming a protective coat on electrodes for a touch panel, and particularly to a method for forming a protective coat suitable for protection of electrodes in an electrostatic capacitive touch panel, to a photosensitive resin composition and a photosensitive element to be used for the same, and to a method for manufacturing a touch panel.

BACKGROUND ART

Liquid crystal display units and touch panels (touch sensors) are used in display devices including large electronic devices such as personal computers and televisions and miniature electronic devices such as car navigation systems, cellular phones and electronic dictionaries or OA•FA devices. Such liquid crystal display units and touch panels are provided with electrodes composed of transparent conductive electrode materials. As transparent conductive electrode materials there are known ITO (Indium-Tin-Oxide), indium oxide and tin oxide, which materials exhibit high visible light transmittance and are therefore the major materials used as electrode materials for liquid crystal display unit boards.

Various types of systems are already being implemented for touch panels, but in recent years the use of electrostatic capacitive touch panels has been progressing. In an electrostatic capacitive touch panel, contact of the fingertip (a conductor) with the touch input screen causes electrostatic capacitive coupling between the fingertip and the conductive film, forming a condenser. Thus, an electrostatic capacitive touch panel detects changes in electrical charge at sites of contact with the fingertip, thereby determining the coordinates.

In particular, projection-type electrostatic capacitive touch panels have satisfactory operativity allowing complex instructions to be carried out since they allow multipoint fingertip detections, and the excellent operativity has led to their utilization as input devices on the display surfaces of devices with small displays such as cellular phones, portable music players and the like.

For representation of two-dimensional coordinates with an X-axis and a Y-axis, a projection-type electrostatic capacitive touch panel generally has a plurality of X-electrodes and a plurality of Y-electrodes perpendicular to the X-electrode forming a two-layer structure, with ITO (Indium-Tin-Oxide) employed as the electrodes.

Incidentally, since the frame region of a touch panel is a region where detection of the touch location is not possible, reducing the area of the frame region has been an important goal in order to increase product value. The frame region requires metal wiring in order to transmit the detection signal of a touch location, but the width of the metal wiring must be narrowed to reduce the frame area. Copper is generally used for metal wirings.

However, in the touch panels mentioned above, corrosive components such as moisture and salts can infiltrate from the sensing region into the interior upon contact with the fingertip. When corrosive components infiltrate into the interior of a touch panel, the metal wiring may corrode, electrical resistance between the electrodes and driving circuits may increase, and wire breakage can occur.

In order to prevent corrosion of metal wirings, there have been disclosed electrostatic capacitive projection-type touch panels with insulating layers formed on metals (Patent document 1, for example). In such touch panels, a silicon dioxide layer is formed on metal by a plasma chemical vapor deposition method (plasma CVD), thereby preventing corrosion of the metal. However, because such methods employ plasma CVD, they require high-temperature treatment, and therefore the base materials are limited and production cost is increased.

Incidentally, known methods for providing resist films on necessary locations include methods in which a photosensitive layer comprising a photosensitive resin composition is provided on a prescribed base material and the photosensitive layer is exposed and developed (Patent documents 2 to 4, for example),

CITATION LIST

Patent Literature

[Patent document 1] Japanese Unexamined Patent Application Publication No. 2011-28594
[Patent document 2] Japanese Unexamined Patent Application Publication HEI No. 7-253666
[Patent document 3] Japanese Unexamined Patent Application Publication No. 2005-99647
[Patent document 4] Japanese Unexamined Patent Application Publication BEI No 11-133617

SUMMARY OF INVENTION

Technical Problem

Fabrication of a protective coat by a photosensitive resin composition can potentially reduce cost compared to plasma CVD. However, when a protective coat is to be formed on an electrode for a touch panel, a large thickness of the protective coat can result in conspicuous level differences between locations with the coat and locations without the coat. The protective coat must therefore be as thin as possible. However, the rust resistance of coats formed from photosensitive resin compositions has not been studied for thicknesses on the level of 10 µm and smaller.

It is an object of the present invention to provide a method for forming a protective coat on an electrode for a touch panel that allows formation of a protective coat with sufficient rust resistance on a desired electrode for a touch panel even as a thin-film, as well as a photosensitive resin composition and photosensitive element that allow formation of such a protective coat, and a method for manufacturing a touch panel.

Solution to Problem

As a result of much diligent research carried out with the aim of solving the problems described above, the present inventors have found that a photosensitive resin composition comprising a specific binder polymer, a specific photopolymerizable compound and a photopolymerization initiator has sufficient developability, while also exhibiting adequate rust resistance even when the coat formed by photocuring has a thickness of 10 µm or smaller, and can adequately prevent corrosion of metals such as copper, and we have thereupon completed this invention.

It is a feature of the method for forming a protective coat on an electrode for a touch panel according to the invention that a photosensitive layer comprising a photosensitive resin composition containing a binder polymer having a carboxyl group and an acid value of 30 to 120 mgKOH/g, a photopolymerizable compound having at least three ethylenic unsaturated groups, and a photopolymerization initiator, is formed on a base material having an electrode for a touch panel, prescribed sections of the photosensitive layer are cured by irradiation with active light rays and then the sections other than the prescribed sections are removed, to form a protective coat comprising the cured sections of the photosensitive layer covering all or a portion of the electrode.

In the method for forming a protective coat on an electrode for a touch panel according to the invention, using the specified photosensitive resin composition ensures developability and adhesiveness on the base material, while allowing formation of a protective coat that has adequate rust resistance even with a thickness of 10 µm or smaller. According to the invention it is possible to use a photosensitive resin composition to form a protective coat having a sufficient aesthetic appearance and rust resistance, thereby making it possible to reduce production cost for production of touch panels.

From the viewpoint of further increasing the rust resistance, the photopolymerizable compound preferably includes at least one compound selected from the group consisting of (meth)acrylate compounds having a pentaerythritol-derived backbone, (meth)acrylate compounds having a dipentaerythritol-derived backbone, (meth)acrylate compounds having a trimethylolpropane-derived backbone and (meth)acrylate compounds having a glycerin-derived backbone.

From the viewpoint of sufficient visibility of the touch panel, the photosensitive layer preferably has a minimum visible light transmittance of 90% or greater at 400 to 700 nm. This is suitable for forming a protective coat covering electrodes in the sensing region.

Also, from the viewpoint of further improving the visibility of the touch panel, the photosensitive layer preferably has a value of −0.2 to 1.0 for b* based on the CIELAB color system. This is suitable for forming a protective coat covering electrodes in the sensing region.

Also, from the viewpoint of obtaining both developability and rust resistance, the photosensitive resin composition preferably further comprises at least one compound selected from the group consisting of triazole compounds, thiadiazole compounds and tetrazole compounds. This will allow both developability and rust resistance to be obtained, to facilitate formation of a protective coat with a satisfactory pattern and rust resistance.

The photopolymerization initiator preferably contains an oxime ester compound and/or a phosphine oxide compound. By containing an oxime ester compound and/or a phosphine oxide compound as the photoinitiator, it will be possible to form a pattern with sufficient resolution even when the photosensitive layer is thin.

In consideration of visibility and aesthetic appearance of the touch panel, a higher transparency is preferred for the protective coat. Conversely, however, the present inventors have found that when patterning a thin photosensitive layer with high transparency, the resolution tends to be reduced. The present inventors believe that the cause of this is that a smaller photosensitive layer thickness increases the effect of light scattering through the base material, generating halation.

According to the invention, however, the photopolymerization initiator contains an oxime ester compound and/or a phosphine oxide compound, thereby allowing pattern formation with adequate resolution.

The present inventors presume that the reason for this effect to be that the oxime site in the oxime ester compound or the phosphine oxide site in the phosphine oxide compound has relatively high photodecomposition efficiency and a suitable threshold value such that it does not decompose with scant levels of leaked light, and therefore the effect of leaked light is minimized.

In the method for forming a protective coat on an electrode for a touch panel according to the invention, a photosensitive element is prepared comprising a support film and a photosensitive layer composed of the photosensitive resin composition provided on the support film, and the photosensitive layer of the photosensitive element can be transferred onto the base material to provide the photosensitive layer. By thus using a photosensitive element, it is possible to significantly contribute to shortening of the production process and reduction of costs, by allowing a roll-to-roll process to be easily accomplished and by shortening the solvent drying step, for example.

The present invention provides a photosensitive resin composition to be used to form a protective coat on an electrode for a touch panel, the composition comprising a binder polymer having a carboxyl group and an acid value of 30 to 120 mgKOH/g, a photopolymerizable compound having at least three ethylenic unsaturated groups, and a photopolymerization initiator.

With a photosensitive resin composition of the invention it is possible to form a protective coat having adequate rust resistance even as a thin-film, on a prescribed electrode for a touch panel.

From the viewpoint of sufficient visibility of the touch panel, the photosensitive resin composition of the invention preferably has a minimum visible light transmittance of 90% or greater when the protective coat has been formed.

Also, from the viewpoint of further improving the visibility of the touch panel, the photosensitive resin composition of the invention preferably has a value of −0.2 to 1.0 for b* based on the CIELAB color system, when the protective coat has been formed.

Also, from the viewpoint of obtaining both developability and rust resistance, the photosensitive resin composition of the invention preferably further comprises at least one compound selected from the group consisting of triazole compounds, thiadiazole compounds and tetrazole compounds.

Furthermore, in the photosensitive resin composition of the invention, the photopolymerization initiator preferably contains an oxime ester compound and/or a phosphine oxide compound. This will allow formation of a thin protective coat with high transparency, in a pattern having sufficient resolution.

The invention further provides a photosensitive element comprising a support film, and a photosensitive layer composed of a photosensitive resin composition according to the invention, formed on the support film.

With a photosensitive element of the invention, it is possible to form a protective coat having adequate rust resistance even as a thin-film, on a prescribed electrode for a touch panel.

The thickness of the photosensitive layer may be 10 μm or smaller.

The invention still further provides a method for manufacturing a touch panel, comprising a step of forming, on a base material with an electrode for a touch panel, a protective coat covering all or a portion of the electrode by the method for forming a protective coat according to the invention.

Advantageous Effects of Invention

According to the invention it is possible to provide a method for forming a protective coat on an electrode for a touch panel that allows formation of a protective coat with sufficient rust resistance on a desired electrode for a touch panel even as a thin-film, as well as a photosensitive resin composition and photosensitive element that allow formation of such a protective coat, and a method for manufacturing a touch panel.

Furthermore, according to the invention it is possible to protect the metal electrodes of electrical capacitance-type touch panels. Also according to the invention it is possible to protect electrodes in the frame regions of touch panels that have increased conductivity by formation of metal layers of copper or the like, that are prone to rusting by moisture or salts.

DESCRIPTION OF EMBODIMENTS

Embodiments for carrying out the invention will now be explained in further detail. However, the present invention is not limited to the embodiments described below. Since the photosensitive resin composition of the invention has particularly excellent transparency and rust resistance, if the object is to protect electrode formed locations of a touch panel (touch sensor), the photosensitive resin composition of the invention can be suitably used regardless of changes to the structure of the touch panel. Specifically, it can be suitably used when the purpose is to protect the electrode-formed locations of a touch panel (touch sensor), even when the touch panel structure has been changed from a 3-layer structure comprising a cover glass, a touch panel and a liquid crystal panel, to a cover glass integrated type or on-cell type.

As used herein, the term "electrode for a touch panel" includes not only the electrode in the sensing region of a touch panel, but also the metal wiring in the frame region. The protective coat may be provided for one or both electrodes.

Also as used herein, "excellent transparency" means 90% or greater permeation of visible light of 400 to 700 nm, and it includes the concept of transparency even with some degree of light scattering.

Throughout the present specification, "(meth)acrylic acid" refers to acrylic acid or methacrylic acid, "(meth)acrylate" refers to acrylate or its corresponding methacrylate, and "(meth)acryloyl group" refers to an acryloyl or methacryloyl group. Also, "(poly)oxyethylene chain" refers to an oxyethylene or polyoxyethylene group, and "(poly)oxypropylene chain" refers to an oxypropylene or polyoxypropylene group. The term "(EO)-modified" refers to a compound with a (poly)oxyethylene chain, the term "(PO)-modified" refers to a compound with a (poly)oxypropylene chain, and "(EO•PO)-modified" refers to a compound with both a (poly)oxyethylene chain and a (poly)oxypropylene chain.

Also as used herein, the term "step" includes not only an independent step, but also cases where it cannot be clearly distinguished from other steps, so long as the desired effect of the step can be achieved. As used herein, a numerical range using "to" represents a range including the numerical values specified as the minimum and maximum values for the range.

Also, the contents of the components in compositions referred to herein, in cases where the composition contains more than one substance corresponding to each component in the composition, are the total amounts of those substances in the composition, unless otherwise specified.

Figure 1:
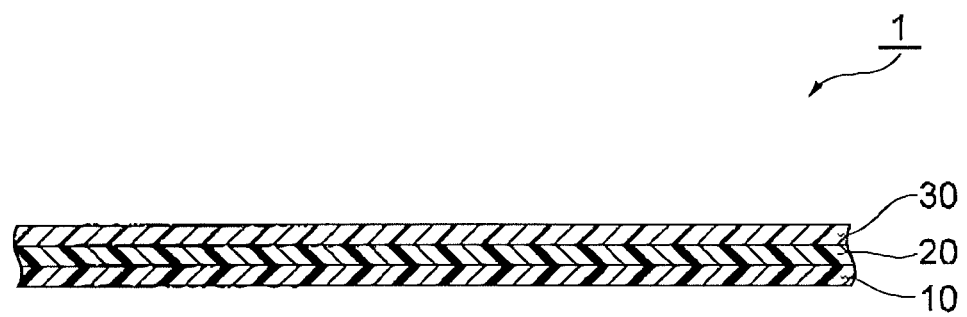
FIG. 1 is a schematic cross-sectional view showing an embodiment of a photosensitive element of the invention.

FIG. 1 is a schematic cross-sectional view showing an embodiment of a photosensitive element of the invention. The photosensitive element 1 shown in FIG. 1 comprises a support film 10, a photosensitive layer 20 composed of a photosensitive resin composition according to the invention formed on the support film 10, and a protective film 30 formed on the side of the photosensitive layer 20 opposite the support film 10.

The photosensitive element 1 of this embodiment can be suitably used to form a protective coat on an electrode for a touch panel.

The support film 10 used may be a polymer film. Examples of polymer films include films made of polyethylene terephthalate, polycarbonate, polyethylene, polypropylene, polyethersulfone and the like.

The thickness of the support film 10 is preferably 5 to 100 μm, more preferably 10 to 70 μm, even more preferably 15 to 40 μm and most preferably 20 to 35 μm, from the viewpoint of ensuring coverability and minimizing reduction in resolution during irradiation with active light rays through the support film 10.

The photosensitive resin composition of the invention that is to form the photosensitive layer 20 contains a binder polymer having a carboxyl group and an acid value of 30 to 120 mgKOH/g (hereunder referred to as component (A)), a photopolymerizable compound having at least three ethylenic unsaturated groups (hereunder referred to as component (B)) and a photopolymerization initiator (hereunder referred to as component (C)).

According to this embodiment, using component (A) having an acid value within the specified range and component (B) satisfying the aforementioned conditions in combination ensures developability and adhesiveness on the base material, while allowing formation of a protective coat with sufficient rust resistance even at thicknesses of 10 μm and smaller. The photosensitive resin composition of this embodiment can therefore form a protective coat capable of exhibiting both an aesthetic appearance and rust resistance.

In a conventional photosensitive element designed from the standpoint of film properties, the photosensitive layer is usually formed to a thickness exceeding 10 μm, and during this time the acid value of the binder polymer in the photosensitive resin composition used is adjusted to ensure developability. The acid value is usually set to a value of about 140 to 250 mgKOH/g. Using such photosensitive resin compositions it has not been possible to obtain sufficient rust resistance when forming protective coats to thicknesses of 10 µm and smaller on electrodes. The present inventors conjecture that the reason for this is that with a thin-film having a thickness of 10 µm or smaller, corrosive components such as moisture and salts can more easily enter the film, and that this tendency increases with a carboxyl group in the binder polymer. If the acid value is too low it will tend to be difficult to ensure sufficient developability and adhesiveness onto the base material, but for this embodiment it is possible that combining component (A) having a suitable acid value and component (B) that can further improve the rust resistance, allowed high levels of both rust resistance and developability to be obtained.

The acid value of the binder polymer as component (A) can be measured in the following manner.
Specifically, a 1 g portion of binder polymer for measurement of the acid value is first precisely weighed out. A 30 g portion of acetone is added to the weighed binder polymer to homogeneously dissolve it. Next, an appropriate amount of phenolphthalein is added to the solution as an indicator, and a 0.1N KOH aqueous solution is used for titration. The acid value is then calculated by the following formula.

Acid value=$0.1 \times Vf = 56.1/(Wp \times I/100)$

In the formula, Vf represents the titer (mL) of the KOH aqueous solution, Wp represents the weight (g) of the solution containing the weighed binder polymer, and I represents the measured proportion (mass %) of nonvolatile components in the solution containing the binder polymer. When the binder polymer is added in admixture with volatile components such as a synthetic solvent or diluting solvent, the acid value is measured after first heating for 1 to 4 hours at a temperature at least 10° C. higher than the boiling point of the volatile components, before weighing, to remove the volatile components.

For this embodiment, the binder polymer as component (A) is preferably a copolymer containing a structural unit derived from (a) (meth)acrylic acid and (b) an alkyl (meth) acrylate ester.

Examples for the (b) alkyl (meth)acrylate include methyl (meth)acrylate, ethyl (meth)acrylate, butyl (meth)acrylate, 2-ethylhexyl (meth)acrylate and hydroxylethyl (meth)acrylate.

The copolymer may also contain in the structural unit another monomer that is copolymerizable with component (a) and/or component (b).

Examples of other monomers that are copolymerizable with component (a) and/or component (b) include tetrahydrofurfuryl (meth)acrylate, dimethylaminoethyl (meth)acrylate, diethylaminoethyl (meth)acrylate, glycidyl (meth)acrylate, benzyl (meth)acrylate, 2,2,2-trifluoroethyl (meth) acrylate, 2,2,3,3-tetrafluoropropyl (meth)acrylate, (meth) acrylamide, (meta)acrylonitrile, diacetone (meth) acrylamide, styrene and vinyltoluene. For synthesis of a binder polymer as component (A), the monomer component used may be of a single type or a combination of two or more types.

The molecular weight of the binder polymer as component (A) is not particularly restricted, but from the viewpoint of coatability, coated film strength and developability, for most cases the weight-average molecular weight is preferably 10,000 to 200,000, more preferably 30,000 to 150,000 and most preferably 50,000 to 100,000. The measuring conditions for the weight-average molecular weight are the same measuring conditions as in the examples of the present specification.

The acid value of the binder polymer as component (A) may be in the range of 30 to 120 mgKOH/g from the viewpoint of allowing development with various known developing solutions during the step of selectively removing the photosensitive resin composition layer by a developing step to form a pattern, and improving resistance to corrosive components such as moisture and salts when it is to function as a protective coat for an electrode.

Also, limiting the acid value of the binder polymer to 30 to 120 mgKOH/g will allow development using an aqueous alkali solution containing water, an alkali metal salt and a surfactant. If the acid value of the binder polymer is 30 mgKOH/g or greater it will be possible to satisfactorily obtain developability, and if it is no greater than 120 mgKOH/g it will be possible to improve the resistance to corrosive components such as moisture and salts.

Also, the acid value of component (A) is preferably 50 to 120 mgKOH/g. If the acid value of component (A) is within this range, it will be possible to obtain sufficient developability even when development is carried out using an aqueous alkali solution such as sodium carbonate, potassium carbonate, tetramethylammonium hydroxide or triethanolamine. From the viewpoint of excellent developability, it is preferably 50 mgKOH/g or greater, more preferably 60 mgKOH/g or greater and even more preferably 70 mgKOH/g or greater. For protection of an electrode for a touch panel, it is more preferably no greater than 100 mgKOH/g and most preferably no greater than 90 mgKOH/ g, from the viewpoint of protecting the electrode from corrosive components such as moisture and salts.

Examples of photopolymerizable compounds having at least three ethylenic unsaturated groups, as component (B), include compounds obtained by reacting α,β-unsaturated saturated carboxylic acids with polyhydric alcohols, such as trimethylolpropane tri(meth)acrylate, tetramethylolmethane tri(meth)acrylate, tetramethylolmethane tetra(meth)acrylate, dipentaerythritol penta(meth)acrylate and dipentaerythritol hexa(meth)acrylate, and compounds obtained by adding α,β-unsaturated carboxylic acids to glycidyl group-containing compounds, such as trimethylolpropane-triglycidyl ether triacrylate.

The photopolymerizable compound having at least three ethylenic unsaturated groups preferably has an acid value of no greater than 5 mgKOH/g from the viewpoint of excellent rust resistance.

From the viewpoint of the ability to minimize electrode corrosion and of facilitated development, the photosensitive resin composition of this embodiment preferably contains at least one selected from among (meth)acrylate compounds with a pentaerythritol derived backbone, (meth)acrylate compounds with a dipentaerythritol derived backbone, (meth)acrylate compounds with a trimethylolpropane derived backbone and (meth)acrylate compounds with a glycerin derived backbone, and more preferably it contains at least one selected from among (meth)acrylate compounds with a dipentaerythritol derived backbone and (meth)acrylate compounds with a trimethylolpropane derived backbone.

A (meth)acrylate having a dipentaerythritol-derived backbone is an ester compound of dipentaerythritol and (meth) acrylic acid, and such ester compounds include compounds modified with alkyleneoxy groups. These ester compounds preferably have 6 ester bonds per molecule, but they may be mixtures of compounds with 1-5 ester bonds.

Also, a (meth)acrylate compound having a trimethylolpropane-derived backbone is an ester compound of trimethylolpropane and (meth)acrylic acid, and such ester compounds include compounds modified with alkyleneoxy groups. These ester compounds preferably have 3 ester bonds per molecule, but they may be mixtures of compounds with 1-2 ester bonds.

Among photopolymerizable compounds having at least three ethylenic unsaturated groups, there are preferred one or more compounds selected from among alkylene oxide-modified trimethylolpropane (meth)acrylate compounds, alkylene oxide-modified tetramethylolmethane (meth)acrylate compounds, alkylene oxide-modified pentaerythritol (meth)acrylate compounds, alkylene oxide-modified dipentaerythritol (meth)acrylate compounds, alkylene oxide-modified glycerin (meth)acrylate compounds and alkylene oxide-modified trimethylolpropane-triglycidyl ether (meth) acrylate compounds, and there are more preferred one or more compounds selected from among alkylene oxide-modified dipentaerythritol (meth)acrylate compounds and alkylene oxide-modified trimethylolpropane (meth)acrylate compounds, from the viewpoint of minimizing electrode corrosion and further facilitating development.

EO-modified pentaerythritol tetraacrylate, for example, may be used as the alkylene oxide-modified tetramethylolmethane (meth)acrylate compound. EO-modified pentaerythritol tetraacrylate is available as RP-1040 (product of Nippon Kayaku Co., Ltd.).

These compounds may be used alone or in combinations of two or more different ones.

The content of component (A) and component (B) in the photosensitive resin composition of this embodiment is preferably 40 to 80 parts by mass of component (A) and 20 to 60 parts by mass of component (B), more preferably 50 to 70 parts by mass of component (A), and 30 to 50 parts by mass of component (B) and even more preferably 55 to 65 parts by mass of component (A) and 35 to 45 parts by mass of component (B), with respect to 100 parts by mass as the total of component (A) and component (B).

If the contents of component (A) and component (B) are within this range, it will be possible to obtain adequate sensitivity while guaranteeing sufficient coatability or film properties of the photosensitive element, and to adequately ensure the photocuring property, developability and electrode corrosion.

The photosensitive resin composition of this embodiment may contain a photopolymerizable compound other than component (B). As a photopolymerizable compound there may be used, for example, component (B) mentioned above in combination with one or more monofunctional monomers or bifunctional monomers.

Examples of monofunctional monomers include (meth) acrylic acid, alkyl (meth)acrylate and monomers that are copolymerizable therewith, which were mentioned as monomers suitable for use in synthesis of the binder polymer as component (A).

Examples of bifunctional vinyl monomers include polyethylene glycol di(meth)acrylate, trimethylolpropane di(meth)acrylate, polypropylene glycol di(meth)acrylate, bisphenol A polyoxyethylenepolyoxypropylene di(meth)acrylate (2,2-bis(4-acryloxypolyethoxypolypropoxyphenyl)propane), bisphenol A diglycidyl ether di(meth)acrylate and the like; and ester compounds of polybasic carboxylic acids (such as phthalic anhydride) and substances having a hydroxyl group and an ethylenic unsaturated group (β-hydroxyethyl acrylate, β-hydroxyethyl methacrylate and the like).

When the photopolymerizable compound as component (B) is to be used in combination with a monofunctional vinyl monomer or bifunctional vinyl monomer, there are no particular restrictions on the mixing proportion of these monomers, but from the viewpoint of the photocuring property and minimizing electrode corrosion, the proportion of the photopolymerizable compound as component (B) is preferably 30 parts by mass or greater, more preferably 50 parts by mass or greater and even more preferably 75 parts by mass or greater, with respect to 100 parts by mass as the total of the photopolymerizable compound in the photosensitive resin composition.

Examples for the photopolymerization initiator as component (C) include aromatic ketones such as benzophenone, N,N,N',N'-tetramethyl-4,4'-diaminobenzophenone (Michler's ketone), N,N,N',N'-tetraethyl-4,4'-diaminobenzophenone, 4-methoxy-4'-dimethylaminobenzophenone and 2-benzyl-2-dimethylamino-1-(4-morpholinophenyl)-butanone-1,2-methyl-1-[4-(methylthio)phenyl]-2-morpholinopropanone-1; benzoinether compounds such as benzoinmethyl ether, benzomethyl ether and benzoinphenyl ether; benzoin compounds such as benzoin, methylbenzoin and ethylbenzoin; oxime ester compounds such as 1,2-octanedione, 1-[4-(phenylthio)phenyl-,2-(O-benzoyloxime)], ethanone,1-[9-ethyl-6-(2-methylbenzoyl)-9H-carbazol-3-yl]-,1-(O-acetyloxime); benzyl derivatives such as benzyldimethylketal; acridine derivatives such as 9-phenylacridine and 1,7-bis(9,9'-acridinyl)heptane; N-phenylglycine derivatives such as N-phenylglycine; coumarin compound; oxazole compound; and phosphine oxide compounds such as 2,4,6-trimethylbenzoyl-diphenyl-phosphine oxide.

Of these, oxime ester compounds and/or phosphine oxide compounds are preferred for transparency of the formed protective coat and pattern formability with film thicknesses of 10 μm and smaller.

In consideration of visibility and aesthetic appearance of the touch panel, a higher transparency is preferred for the protective coat. On the other hand, the present inventors have found that when patterning a thin photosensitive layer with high transparency, the resolution tends to be reduced. The present inventors believe that the cause of this is that a smaller photosensitive layer thickness increases the effect of light scattering through the base material, generating halation. However, including an oxime ester compound and/or a phosphine oxide compound as component (C) allows pattern formation with adequate resolution.

The present inventors presume that the reason for this effect to be that the oxime site in the oxime ester compound or the phosphine oxide site in the phosphine oxide compound has relatively high photodecomposition efficiency and a suitable threshold value such that it does not decompose with scant levels of leaked light, and therefore the effect of leaked light is minimized.

Oxime ester compounds include compounds represented by the following formulas (C-1) and formula (C-2), but compounds represented by the following formula (C-1) are preferred from the viewpoint of fast-curing properties and transparency.

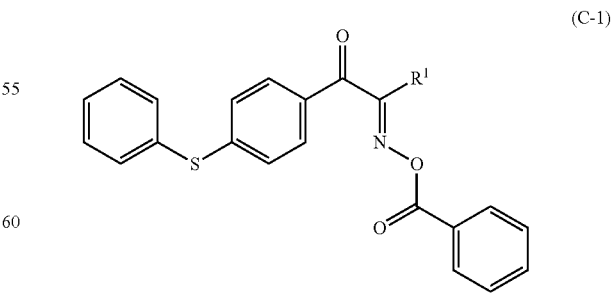

(C-1)

In formula (C-1), $R^1$ represents a C1-12 alkyl or C3-20 cycloalkyl group. So long as the effect of the invention is not impeded, a substituent may be present on the aromatic ring in formula (C-1).

In formula (C-1), $R^1$ is preferably a C3-10 alkyl or C4-15 cycloalkyl group, and more preferably a C4-8 alkyl or C4-10 cycloalkyl group.

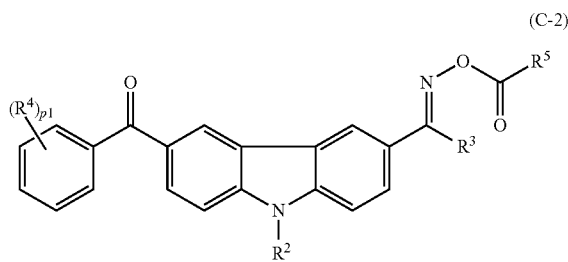

(C-2)

In formula (C-2), $R^2$ represents hydrogen or a C1-12 alkyl group, $R^3$ represents a $C_1$-12 alkyl or C3-20 cycloalkyl group, $R^4$ represents a C1-12 alkyl group and $R^5$ represents a C1-20 alkyl or aryl group. The symbol p1 represents an integer of 0-3. When p1 is 2 or greater, the multiple $R^4$ groups may be the same or different. The carbazole ring may also have a substituent so long as the effect of the invention is not impeded.

In formula (C-2), $R^2$ is preferably a C1-8 alkyl group, more preferably a C1-4 alkyl group and even more preferably an ethyl group.

In formula (C-2), $R^3$ is preferably a C1-8 alkyl or C4-15 cycloalkyl group, and more preferably a C1-4 alkyl or C4-10 cycloalkyl group.

The compound represented by formula (C-1) may be 1,2-octanedione,1-[4-(phenylthio)phenyl-,2-(O-benzoyloxime)] or the like. The compound represented by formula (C-2) may be ethanone, 1-[9-ethyl-6-(2-methylbenzoyl)-9H-carbazol-3-yl]-,1-(O-acetyloxime) or the like. The compound 1,2-octanedione,1-[4-(phenylthio)phenyl-,2-(O-benzoyloxime)] is available as IRGACURE OXE 01 (trade name of BASF Corp.). Also, ethanone,1-[9-ethyl-6-(2-methylbenzoyl)-9H-carbazol-3-yl]-,1-(O-acetyloxime) is commercially available as IRGACURE OXE 02 (trade name of BASF Corp). They may be used alone or in combinations of two or more.

The compound 1,2-octanedione,1-[4-(phenylthio)phenyl-,2-(O-benzoyloxime)] is especially preferred for formula (C-1). Particularly preferred for formula (C-2) is ethanone,1-[9-ethyl-6-(2-methylbenzoyl)-9H-carbazol-3-yl]-,1-(O-acetyloxime).

The phosphine oxide compound may be a compound represented by the following formula (C-3) or formula (C-4). From the viewpoint of fast-curing properties and transparency, a compound represented by the following formula (C-3) is preferred.

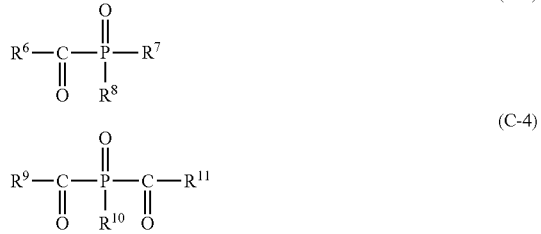

In formula (C-3), $R^6$, $R^7$ and $R^8$ each independently represent a C1-20 alkyl or aryl group. In formula (C-4), $R^9$, $R^{10}$ and $R^{11}$ each independently represent a C1-20 alkyl or aryl group.

When $R^6$, $R^7$ or $R^8$ in formula (C-3) is a C1-20 alkyl group, or when $R^9$, $R^{10}$ or $R^{11}$ in formula (C-4) is a C1-20 alkyl group, the alkyl group may be straight-chain, branched-chain or cyclic. The number of carbon atoms of the alkyl groups is more preferably 5 to 10.

When $R^6$, $R^7$ or $R^8$ in formula (C-3) is an aryl group or when $R^9$, $R^{10}$ or $R^{11}$ in formula (C-4) is an aryl group, the aryl group may be optionally substituted. Examples of substituents include C1-6 alkyl and C1-4 alkoxy groups.

Of these, $R^6$, $R^7$ and $R^8$ in formula (C-3) are preferably aryl groups. Also, $R^9$, $R^{10}$ and $R^{11}$ in formula (C-4) are preferably aryl groups.

The compound represented by formula (C-3) is preferably 2,4,6-trimethylbenzoyl-diphenyl-phosphine oxide, in consideration of transparency of the protective coat to be formed and pattern formability with a film thickness of 10 μm or smaller. The compound 2,4,6-trimethylbenzoyl-diphenyl-phosphine oxide is commercially available as LUCIRIN TPO (trade name of BASF Corp.), for example.

The content of the photopolymerization initiator as component (C) is preferably 0.1 to 20 parts by mass, more preferably 1 to 10 parts by mass and more preferably 2 to 5 parts by mass, with respect to 100 parts by mass as the total of component (A) and component (B).

If the content of component (C) is within this range it will be possible to obtain sufficient photosensitivity while also minimizing problems such as increasing absorption on the surface of the composition upon irradiation with active light rays that results in incomplete photocuring of the interior, or reduced visible light transmittance.

From the viewpoint of obtaining both developability and rust resistance, the photosensitive resin composition of this embodiment preferably further comprises at least one compound selected from the group consisting of triazole compounds, thiadiazole compounds and tetrazole compounds (hereunder also referred to as "component (D)").

Triazole compounds include benzotriazole, 1H-benzotriazole-1-acetonitrile, benzotriazole-5-carboxylic acid, 1H-benzotriazole-1-methanol, carboxybenzotriazole, triazole compounds containing mercapto groups such as 3-mercaptotriazole, and triazole compounds containing amino groups such as 3-amino-5-mercaptotriazole.

Thiadiazole compounds include 2-amino-5-mercapto-1,3,4-thiadiazole and 2,1,3-benzothiadiazole.

Tetrazole compounds include compounds represented by the following formula (D-1),

(D-1)

In formula (D-1), $R^{11}$ and $R^{12}$ each independently represent hydrogen, C1-20 alkyl, amino, mercapto or carboxymethyl. Alkyl groups include methyl, ethyl, propyl and the like.

Specific examples of tetrazole compounds represented by formula (D-1) include 1H-tetrazole, 5-amino-1H-tetrazole, 5-methyl-1H-tetrazole, 1-methyl-5-ethyl-tetrazole, 1-methyl-5-mercapto-tetrazole and 1-carboxymethyl-5-mercapto-tetrazole.

As component (D) there may also be used water-soluble salts of tetrazole compounds represented by formula (D-1).

Specific examples include salts of 1-carboxymethyl-5-mercapto-tetrazole with alkali metals such as sodium, potassium and lithium.

Particularly preferred among these for component (D) are 1H-tetrazole, 5-amino-1H-tetrazole and 1-methyl-5-mercapto-1H-tetrazole, from the viewpoint of electrode corrosion reducing ability, adhesiveness with metal electrodes, facilitated development and transparency.

These tetrazole compounds and their water-soluble salts may be used alone, or two or more may be used in combination.

Also, from the viewpoint of further improving the developability when the electrode surface to be provided with the protective coat has a metal such as copper, silver or nickel, the photosensitive resin composition preferably further comprises a tetrazole compound with an amino group among the aforementioned compounds. This can reduce development residue and facilitate formation of a protective coat with a satisfactory pattern. The reason for this may be that adding a tetrazole compound with an amino group results in satisfactory balance between solubility in the developing solution and adhesive force with the metal.

Including an amino group-containing tetrazole compound will exhibit the effect described above, and therefore the photosensitive resin composition and photosensitive element of this embodiment will be suitable for formation of a protective coat for protection of an electrode in the frame region of a touch panel that has increased conductivity by formation of a metal layer such as copper.

The content of component (D) in the photosensitive resin composition of this embodiment is preferably 0.05 to 10.0 parts by mass, more preferably 0.1 to 2.0 parts by mass and even more preferably 0.2 to 1.0 part by mass with respect to 100 parts by mass as the total of component (A) and component (B).

If the content of component (D) is within this range it will be possible to minimize problems such as reduced developability and resolution, while obtaining a sufficient effect of inhibiting electrode corrosion and improving adhesiveness with metal electrodes.

The photosensitive resin composition of this embodiment may also contain, if necessary, a tackifier such as a silane coupling agent, or a leveling agent, plasticizer, filler, antifoaming agent, flame retardant, stabilizer, antioxidant, aromatic, thermal crosslinking agent, polymerization inhibitor or the like, at about 0.01 to 20 parts by mass each with respect to 100 parts by mass as the total of component (A) and component (B). They may be used alone or in combinations of two or more.

The minimum visible light transmittance of the photosensitive resin composition of this embodiment at 400 to 700 nm is preferably 90% or greater, more preferably 92% or greater and even more preferably 95% or greater.

The visible light transmittance of the photosensitive resin composition is determined in the following manner.
First, a support film is coated with a coating solution containing the photosensitive resin composition, to a post-drying thickness of no greater than 10 μm, and it is dried to form a photosensitive resin composition layer. Next, it is laminated onto a glass panel using a laminator, with the photosensitive resin composition layer in contact. A measuring sample is thus obtained having a photosensitive resin composition layer and a support film laminated on a glass panel. The obtained measuring sample is then irradiated with ultraviolet rays to photocure the photosensitive resin composition layer, after which an ultraviolet and visible spectrophotometer is used to measure the transmittance in a measuring wavelength range of 400 to 700 μnm.

If the transmittance is at least 90% in a wavelength range of 400 to 700 nm, which are light rays in the ordinary visible light wavelength range, for example, when a transparent electrode in the sensing region of a touch panel (touch sensor) is to be protected, or when the protective coat is visible from the edges of the sensing region after a metal layer (such as a copper layer formed on an ITO electrode) in the frame region of a touch panel (touch sensor) has been protected, it will be possible to satisfactorily minimize reduction in the image display quality, color shade and brightness in the sensing region.

Also, from the viewpoint of further improving the visibility of the touch panel, the photosensitive resin composition of this embodiment has a value of preferably −0.2 to 1.0, more preferably 0.0 to 0.7 and even more preferably 0.1 to 0.5 for b* based on the CIELAB color system, when the protective coat has been formed. As with a minimum visible light transmittance of 90% or greater, b* is preferably −0.2 to 1.0 from the viewpoint of preventing reduction in image display quality and color shade in the sensing region. Measurement of b* based on the CIELAB color system can be accomplished, for example, using a "CM-5" spectrocolorimeter by Konica Minolta Holdings, Inc., forming a photosensitive resin composition layer with a thickness of no greater than 10 μm on a glass panel with a thickness of 0.7 mm, irradiating it with ultraviolet rays to photocure the photosensitive resin composition layer, and then performing measurement with a D65 light source and the viewing angle set to 2°.

The photosensitive resin composition of the invention may be used to form a photosensitive layer on a base material that has an electrode for a touch panel. For example, a coating solution that can be obtained by uniformly dissolving or dispersing the photosensitive resin composition in a solvent may be coated on a base material to form a coating film, and the solvent removed by drying to form a photosensitive layer.

The solvent used may be a ketone, aromatic hydrocarbon, alcohol, glycol ether, glycol alkyl ether, glycol alkyl ether acetate, ester, diethylene glycol, chloroform, methylene chloride or the like, from the viewpoint of the solubility of each component and ease of coating film formation. These solvents may be used alone, or a mixed solvent may be used, comprising two or more different solvents.

Preferred for use among these solvents are ethyleneglycol monobutyl ether acetate, diethyleneglycol monoethyl ether acetate, diethyleneglycol diethyl ether, diethyleneglycol ethyl methyl ether, diethyleneglycol dimethyl ether, propyleneglycol monomethyl ether and propyleneglycol monomethyl ether acetate.

The photosensitive resin composition of this embodiment is preferably used to form a photosensitive film, as for the photosensitive element 1 of this embodiment. By laminating a photosensitive film on a base material 100 with an electrode for a touch panel, it is possible to significantly contribute to shortening of the production process and reduction of costs, by allowing a roll-to-roll process to be easily accomplished and by shortening the solvent drying step, for example.

The photosensitive layer 20 of the photosensitive element 1 can be formed by preparing a coating solution containing the photosensitive resin composition of this embodiment, and coating and drying it on a support film 10. The coating solution can be obtained by uniformly dissolving or dispersing each of the components used to form the photosensitive resin composition of this embodiment, in a solvent.

There are no particular restrictions on the solvent, and a known one may be used such as acetone, methyl ethyl ketone, methyl isobutyl ketone, toluene, methanol, ethanol, propanol, butanol, methylene glycol, ethylene glycol, propylene glycol, ethylene glycol monomethyl ether, ethyleneglycol monoethyl ether, diethyleneglycol dimethyl ether, diethyleneglycol ethyl methyl ether, diethyleneglycol diethyl ether, propyleneglycol monomethyl ether, ethyleneglycol monobutyl ether acetate, diethyleneglycol monoethyl ether acetate, propyleneglycol monomethyl ether acetate, chloroform or methylene chloride, for example. These solvents may be used alone, or a mixed solvent may be used, comprising two or more different solvents.

The coating method may be, for example, doctor blade coating, Meyer bar coating, roll coating, screen coating, spinner coating, ink-jet coating, spray coating, dip coating, gravure coating, curtain coating or die coating.

There are no particular restrictions on the drying conditions, but the drying temperature is preferably 60° C. to 130° C. and the drying time is preferably 30 seconds to 30 minutes.

The thickness of the photosensitive layer 20 is preferably 1 μm to 10 μm, more preferably 1 μm to 9 μm, even more preferably 1 μm to 8 μm, yet more preferably 2 μm to 8 μm and most preferably 3 μm to 8 μm, as the post-drying thickness, in order to exhibit an adequate effect for electrode protection, such as rust resistance, and to reduce to a minimum any level differences on the touch panel (touch sensor) surface that are produced by partial electrode-protecting coat formation.

The minimum visible light transmittance of the photosensitive layer 20 for this embodiment is preferably 90% or greater, more preferably 92% or greater and even more preferably 95% or greater. Also, the photosensitive layer 20 is preferably modified so that the value of b* based on the CIELAB color system is −0.2 to 1.0.

The viscosity of the photosensitive layer 20 at 30° C. is preferably 15 to 100 mPa·s, more preferably 20 to 90 mPa·s and even more preferably 25 to 80 mPa·s, from the viewpoint of preventing, for a period of one month or longer, exudation of the photosensitive resin composition from the edges of the photosensitive element 1 when the photosensitive element has been taken up into a roll, and from the viewpoint of preventing exposure defects and development residue during irradiation of active light rays, caused by adhesion of fragments of the photosensitive resin composition on the substrate when the photosensitive element 1 is cut.

The viscosity is the value obtained by forming a circular film with a diameter of 7 mm and a thickness of 2 mm from the photosensitive resin composition as a measuring sample, measuring the rate of change in thickness upon adding a load of $1.96 \times 10^{-2}$ N at 30° C. and 80° C. in the thickness direction of the sample, and calculating the viscosity from the change in thickness, assuming a Newtonian fluid.

The protective film 30 (cover film) may be, for example, a film composed of polyethylene, polypropylene, polyethylene terephthalate, polycarbonate, polyethylene-vinyl acetate copolymer or polyethylene-vinyl acetate copolymer, or a laminated film of polyethylene-vinyl acetate copolymer and polyethylene.

The thickness of the protective film 30 is preferably about 5 to 100 μm, but from the viewpoint of curled storage as a roll, it is preferably no greater than 70 μm, more preferably no greater than 60 μm, even more preferably no greater than 50 μm and most preferably no greater than 40 μm.

The photosensitive element 1 may be placed in curled storage as a roll, or used directly.

According to the invention, a coating solution containing the photosensitive resin composition of this embodiment and a solvent is coated onto a base material having an electrode for a touch panel, and dried to form a photosensitive layer 20 composed of the photosensitive resin composition. For this purpose as well, the photosensitive layer preferably satisfies the aforementioned conditions for film thickness, visible light transmittance and CIELAB color system b* value.

Figure 2:
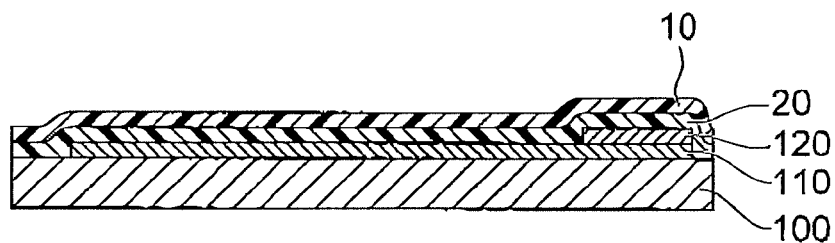
FIG. 2 is a schematic cross-sectional view for illustration of an embodiment of a method for forming a protective coat on an electrode for a touch panel according to the invention.
Figure 2:
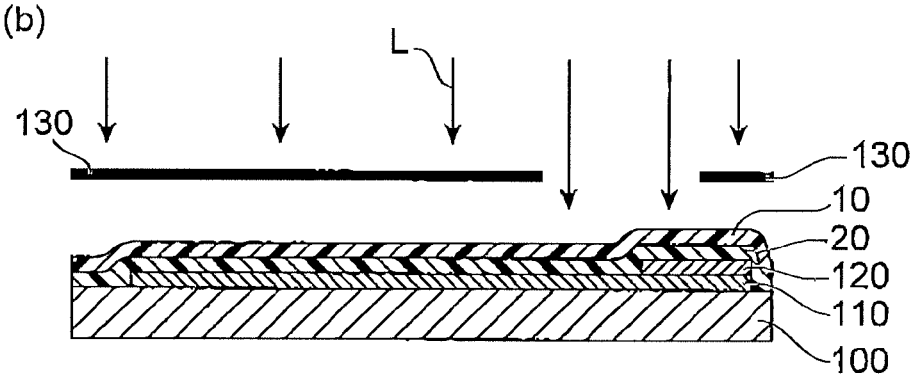
Figure 2:
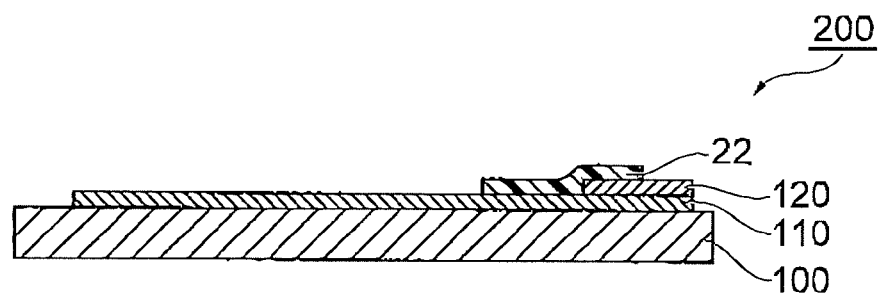

A method for forming a protective coat on an electrode for a touch panel according to the invention will now be described. FIG. 2 is a schematic cross-sectional view for illustration of an embodiment of a method for forming a protective coat on an electrode for a touch panel according to the invention.

The method for forming a protective coat 22 on an electrode for a touch panel according to this embodiment comprises a first step in which a photosensitive layer 20 comprising a photosensitive resin composition according to this embodiment is formed on a base material 100 having electrodes for a touch panel 110 and 120, a second step in which prescribed sections of the photosensitive layer 20 are cured by irradiation with active light rays, and a third step in which the sections other than the prescribed sections of the photosensitive layer 20 (the sections of the photosensitive layer that have not been irradiated with active light rays) are removed after the irradiation with active light rays, to form a protective coat 22 comprising the cured sections of the photosensitive layer covering all or a portion of the electrodes. A protective coat 22-covered touch panel 200 is thus obtained as a touch input sheet.

The base material 100 to be used for this embodiment may be a substrate such as a glass plate, plastic sheet or ceramic sheet commonly used for touch panels (touch sensors). An electrode for a touch panel on which the protective coat is to be formed is provided on the substrate. The electrode may be an ITO, Cu, Al or Mo electrode, or TFT. An insulating layer may also be provided on the substrate between the substrate and the electrode.

The base material 100 having electrodes for a touch panel 110 and 120 shown in FIG. 2 can be obtained by the following procedure, for example. After forming a metal film by sputtering in the order ITO, Cu on the base material 100 such as a PET film, a photosensitive film for etching is attached onto the metal film, a desired resist pattern is formed, and the unwanted Cu is removed with an etching solution such as an iron chloride aqueous solution, after which the resist pattern is peeled off.

In the first step of this embodiment, the protective film 30 of the photosensitive element 1 of this embodiment is removed and then the photosensitive layer 20 is transferred onto the surface of the base material 100 on which the electrodes for a touch panel 110 and 120 are formed, by contact bonding while heating the photosensitive element 1, to accomplish lamination (see FIG. 2(a)).

The contact bonding means may be a contact bonding roll. The contact bonding roll may be one provided with heating means to allow thermocompression bonding.

The heating temperature for thermocompression bonding is preferably 10° C. to 180° C., more preferably 20° C. to 160° C. and even more preferably 30° C. to 150° C. so that the constituent components of the photosensitive layer 20 will be more resistant to thermosetting or thermal decomposition, while ensuring sufficient adhesiveness between the photosensitive layer 20 and the base material 100 and sufficient adhesiveness between the photosensitive layer 20 and the electrodes for a touch panel 110 and 120.

Also, the contact bonding pressure during thermocompression bonding is preferably 50 to $1\times10^5$ N/m, more preferably $2.5\times10^2$ to $5\times10^4$ N/m and even more preferably $5\times10^2$ to $4\times10^4$ N/m as linear pressure, from the viewpoint of minimizing deformation of the base material 100 while ensuring sufficient adhesiveness between the photosensitive layer 20 and the base material 100.

If the photosensitive element 1 is heated in this manner it will not be necessary to perform preheating treatment of the base material, although preheating treatment of the base material 100 is preferred from the viewpoint of further increasing adhesiveness between the photosensitive layer 20 and the base material 100. The preheating temperature is preferably 30° C. to 180° C.

For this embodiment, instead of using a photosensitive element 1, a coating solution containing the photosensitive resin composition of this embodiment and a solvent may be prepared and coated and dried onto the surface of the base material 100 on which the electrodes for a touch panel 110 and 120 have been formed, to form a photosensitive layer 20.

The photosensitive layer 20 preferably satisfies the aforementioned conditions for film thickness, visible light transmittance and CIELAB color system b* value.

In the second step of this embodiment, active light rays L are irradiated in a pattern on prescribed sections of the photosensitive layer 20, through a photomask 130 (see FIG. 2(b)).

For irradiation of the active light rays, if the support film 10 on the photosensitive layer 20 is transparent it will be possible to irradiate the active light rays directly, but if it is opaque the active light rays are irradiated after removing it. From the viewpoint of protecting the photosensitive layer 20, preferably a transparent polymer film is used as the support film 10 and the polymer film is left on it, with the active light irradiation being performed through it.

The light source used for irradiation of the active light rays L may be a known active light source such as a carbon arc lamp, ultra-high-pressure mercury lamp, high-pressure mercury lamp or xenon lamp, with no particular restrictions so long as the ultraviolet rays can be effectively emitted.

The exposure dose for the active light rays L will usually be $1\times10^2$ to $1\times10^4$ J/m$^2$, and the irradiation may also be accompanied by heating. If the active light ray exposure dose is less than $1\times10^2$ J/m$^2$ the photocuring effect will tend to be inadequate, and if it is greater than $1\times10^4$ J/m$^2$ the photosensitive layer 20 will tend to undergo discoloration.

In the third step of this embodiment, the photosensitive layer 20 that has been irradiated with active light rays is developed with a developing solution to remove the sections that have not been exposed to active light rays (i.e. the sections other than the prescribed sections of the photosensitive layer), to form a protective coat 22 composed of the cured sections of the photosensitive layer of this embodiment covering all or a portion of the electrode (see FIG. 2(c)). The protective coat 22 formed may have a prescribed pattern.

When the support film 10 is layered on the photosensitive layer 20 after irradiation with active light rays, it is first removed, and then development is carried out with a developing solution for removal of the sections that have not been exposed to the active light rays.

The developing method preferably accomplishes development by a known method such as spraying, showering, reciprocal dipping, brushing or scrapping using a known developing solution such as an aqueous alkali solution, aqueous developing solution or organic solvent, and removal of the unwanted sections, and the use of an aqueous alkali solution is preferred from the viewpoint of the environment and safety.

Among aqueous alkali solutions it is preferred to use a sodium carbonate aqueous solution. For example, a dilute sodium carbonate solution (0.5 to 5 mass % aqueous solution) at 20° C. to 50° C. is preferably used.

The developing temperature and time can be adjusted to match the developability of the photosensitive resin composition for this embodiment.

The aqueous alkali solution may also contain, added surfactants, antifoaming agents, and small amounts of organic solvents to accelerate development.

After development, the base of the aqueous alkali solution remaining on the photosensitive layer 20 after photocuring may be subjected to acid treatment (neutralizing treatment) by a known method such as spraying, reciprocal dipping, brushing, scrapping or the like using an organic acid or inorganic acid, or an aqueous solution of such acids.

A step of rinsing may also be carried out after acid treatment (neutralizing treatment).

Following development, the cured film may be further cured by irradiation with active light rays (for example, $5\times10^3$ to $2\times10^4$ J/m$^2$), if necessary. The photosensitive resin composition of this embodiment exhibits excellent adhesiveness for metals even without a heating step after development, but if necessary it may be subjected to heat treatment (80° C. to 250° C.) instead of irradiation with active light rays or in combination with irradiation with active light rays, after development.

Thus, the photosensitive resin composition and photosensitive element of this embodiment can be suitably used for formation of a protective coat on an electrode for a touch panel. For this use of the photosensitive resin composition, a coating solution in admixture with a solvent may be used to form the protective coat.

The invention further provides a material for forming a protective coat on an electrode for a touch panel, comprising a photosensitive resin composition according to the invention. The material for forming a protective coat on an electrode for a touch panel may comprise a photosensitive resin composition of the embodiment described above, and it is preferably a coating solution further containing the solvent mentioned above.

Figure 3:
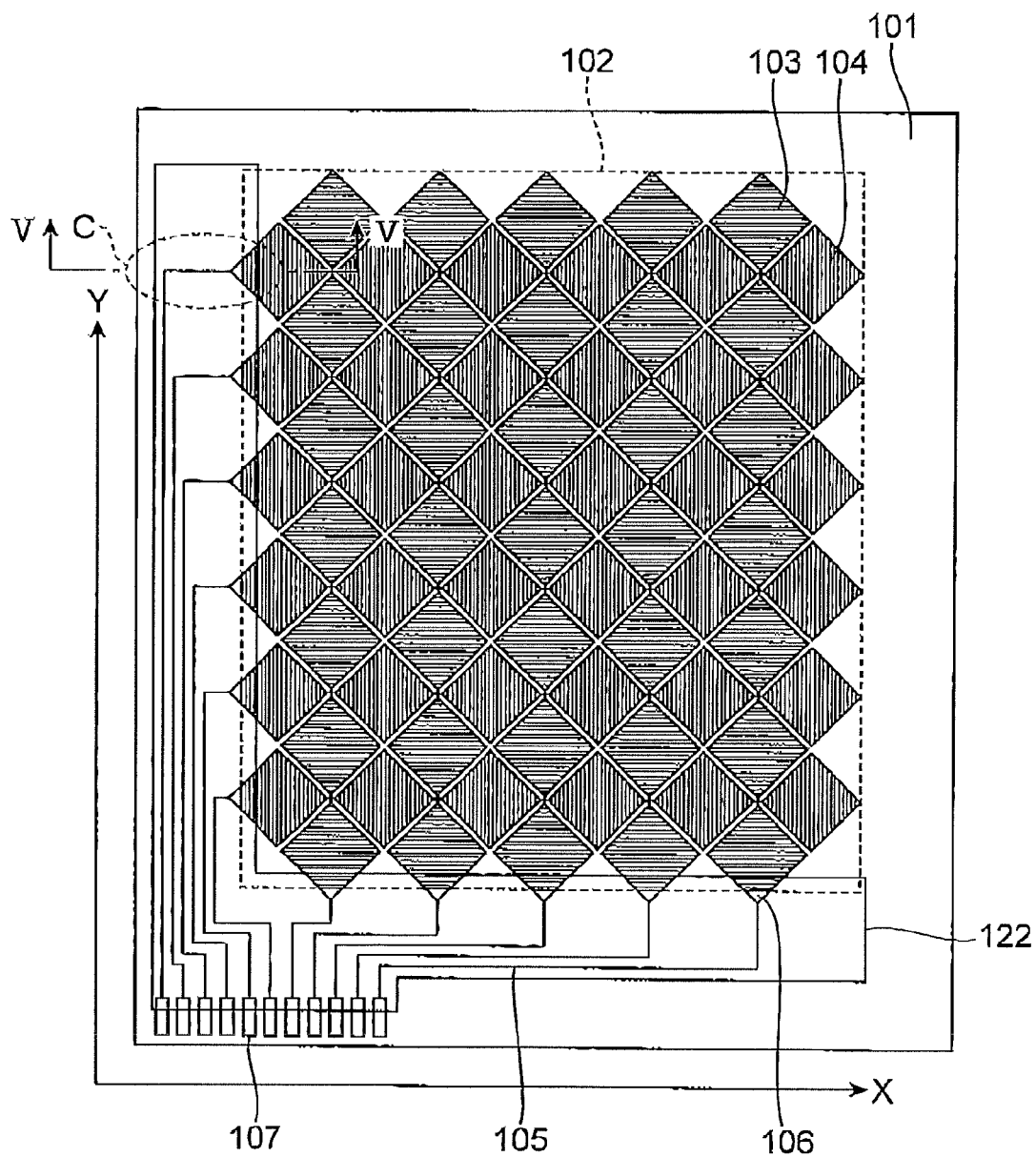
FIG. 3 is a schematic top view showing an example of an electrostatic capacitive touch panel.
Figure 4:
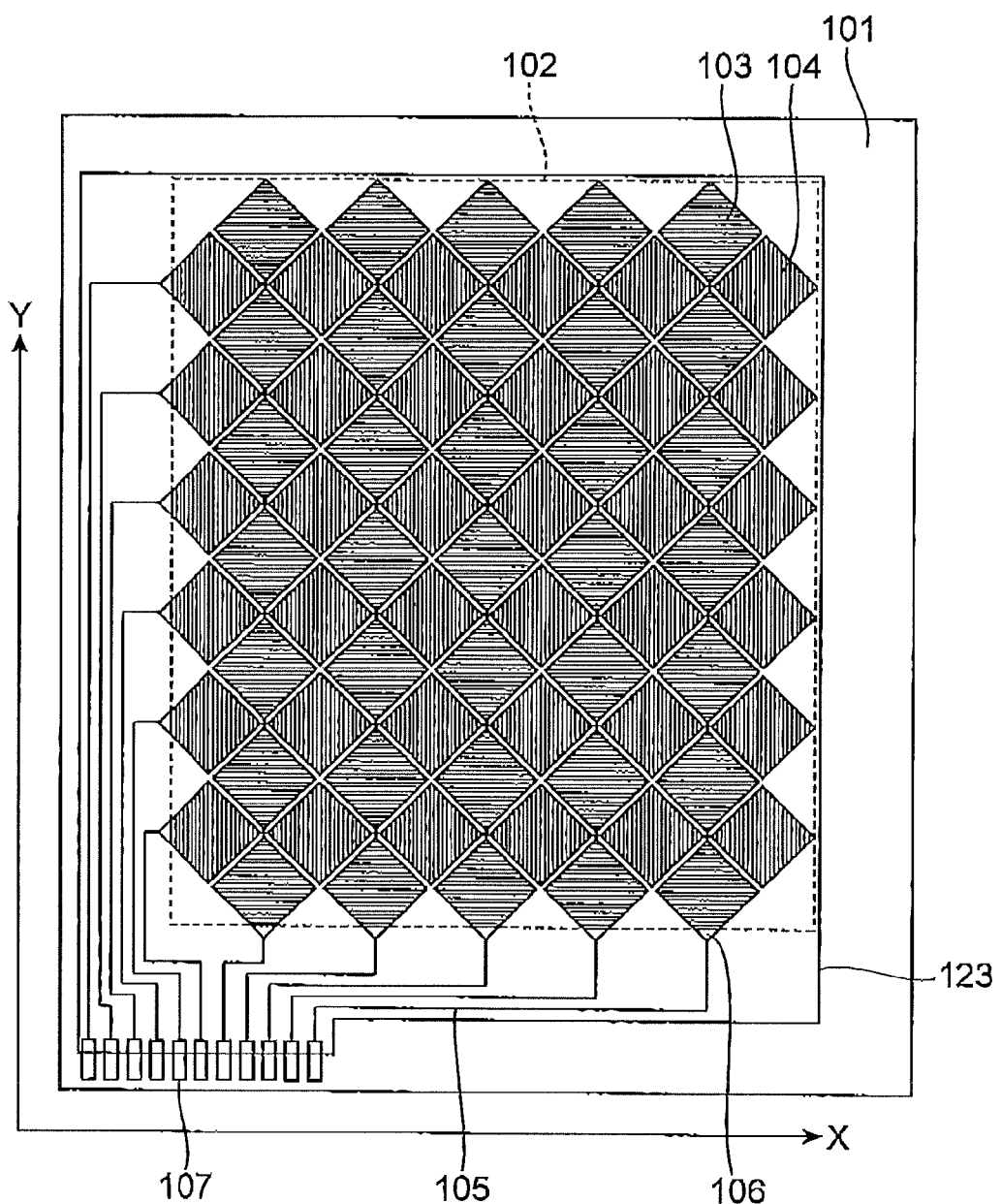
FIG. 4 is a schematic top view showing another example of an electrostatic capacitive touch panel.
Figure 5:
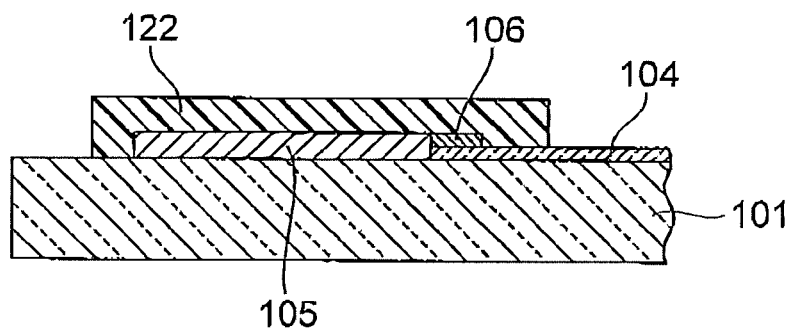
FIG. 5(a) is a partial cross-sectional view of section C of FIG. 3 along line V-V, and (b) is a partial cross-sectional view showing another mode thereof.
Figure 5:
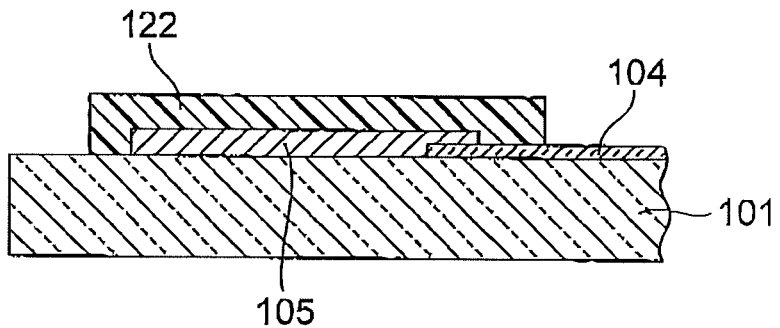

An example of a part using a protective coat of the invention will now be described with reference to FIG. 3, FIG. 4 and FIG. 5. FIG. 3 is a schematic top view showing an example of an electrostatic capacitive touch panel. The touch panel illustrated in FIG. 3 has a touch screen 102 for detection of touch location coordinates on one side of a transparent substrate 101, and provided on the substrate 101 are transparent electrodes 103 and transparent electrodes 104 for detection of changes in electrostatic capacity in this region. The transparent electrodes 103 and transparent electrodes 104 detect the X-position coordinate and Y-position coordinate, respectively, of the touch location.

On the transparent substrate 101 there are provided lead wirings 105 to transmit touch location detection signals from the transparent electrodes 103 and transparent electrodes 104 to an external circuit. Also, the lead wirings 105 and the transparent electrodes 103 and transparent electrodes 104 are connected by connecting electrodes 106 provided on the transparent electrodes 103 and transparent electrodes 104. On the side opposite the connecting sections between the lead wirings 105 and the transparent electrodes 103 and transparent electrodes 104, there are provided connecting terminals 107 with an external circuit. The photosensitive resin composition of this embodiment can be suitably used to form a protective coat 122 for the lead wirings 105, connecting electrodes 106 and connecting terminals 107. This allows simultaneous protection of the electrodes in the sensing region (touch screen 102). In FIG. 3, the protective coat 122 protects the lead wirings 105, connecting electrodes 106, some of the electrodes in the sensing region and some of the connecting terminals 107, but the location where the protective coat is provided may be changed as appropriate. For example, as shown in FIG. 4, the protective coat 123 may be provided protecting the entire touch screen 102.

The cross-sectional structure of the connecting section between the transparent electrodes and lead wirings in the touch panel shown in FIG. 3 will now be explained with reference to FIG. 5. FIG. 5 is a partial cross-sectional view of section C in FIG. 3 along line V-V, showing a connecting section between a transparent electrode 104 and a lead wiring 105. As shown in FIG. 5(a), the transparent electrode 104 and the lead wiring 105 are electrically connected via a connecting electrode 106. Also as shown in FIG. 5(a), part of the transparent electrode 104, and all of the lead wiring 105 and connecting electrode 106, are covered by the protective coat 122. Likewise, the transparent electrode 103 and the lead wiring 105 are electrically connected via a connecting electrode 106. As shown in FIG. 5(b), the transparent electrode 104 and the lead wiring 105 are electrically connected in a direct manner. The photosensitive resin composition and photosensitive element of this embodiment can be suitably used for formation of a protective coat in the structural section described above.

A method for manufacturing a touch panel according to this embodiment will now be explained. First, transparent electrodes X-position coordinate) 103 are formed on a transparent electrode 101 provided on a base material 100. Next, transparent electrodes (Y-position coordinate) 104 are formed. Formation of the transparent electrodes 103 and transparent electrodes 104 may be accomplished by a method of etching a transparent electrode layer formed on the transparent base material 100.

Next, on the surface of the transparent substrate 101 there are formed lead wirings 105 for connection to an external circuit and connecting electrodes 106 connecting the lead wirings with the transparent electrodes 103 and transparent electrodes 104. The lead wirings 105 and connecting electrodes 106 may be formed after formation of the transparent electrodes 103 and transparent electrodes 104, or they may be formed simultaneously during formation of the respective transparent electrodes. The lead wirings 105 and connecting electrodes 106 may be formed by metal sputtering followed by etching or the like. The lead wirings 105 can be formed simultaneously with formation of the connecting electrodes 106, for example, using a conductive paste material containing silver flakes, by screen printing or the like. Next, connecting terminals 107 are formed for connection between the lead wirings 105 and an external circuit.

In order to cover the transparent electrodes 103 and transparent electrodes 104, the lead wirings 105, the connecting electrodes 106 and the connecting terminals 107 formed by this step, the photosensitive element 1 of this embodiment is contact bonded and a photosensitive layer 20 is provided over the electrodes. Next, the transferred photosensitive layer 20 is exposed to active light rays L in a pattern through a photomask having a prescribed shape. After irradiation of the active light rays L, development is performed and all but the prescribed sections of the photosensitive layer 20 are removed, to form a protective coat 122 composed of the cured sections of the photosensitive layer 20. It is possible in this manner to produce a touch panel provided with a protective coat 122.

EXAMPLES

The present invention will now be explained in greater detail by examples. However, the present invention is not limited to the examples described below.

[Preparation of Binder Polymer Solution (A1)]
In a flask equipped with a stirrer, a reflux condenser, an inert gas inlet and a thermometer there was charged component (1) listed in Table 1, the temperature was raised to 80° C. under a nitrogen gas atmosphere, and component (2) listed in Table 1 was added dropwise uniformly over a period of 4 hours while maintaining a reaction temperature of 80° C.±2° C. After the dropwise addition of component (2), stirring is continued at 80° C.±2° C. for 6 hours, to obtain a solution of a binder polymer with a weight-average molecular weight of approximately 65,000 and an acid value of 78 mgKOH/g (45 mass % solid) (A1).

[Preparation of Binder Polymer Solution (A2)]
A solution of a binder polymer with a weight-average molecular weight of approximately 80,000 and an acid value of 115 mgKOH/g (45 mass % solid) (A2) was obtained in the same manner as (A1).

[Preparation of Binder Polymer Solution (A3)]
A solution of a binder polymer with a weight-average molecular weight of approximately 35,000 and an acid value of 156 mgKOH/g (45 mass % solid) (A3) was obtained in the same manner as (A1).

[Preparation of Binder Polymer Solution (A4)]
A solution of a binder polymer with a weight-average molecular weight of approximately 45,000 and an acid value of 195 mgKOH/g (45 mass % solid) (A4) was obtained in the same manner as (A1).

[Preparation of Binder Polymer Solution (A5)]
A solution of a binder polymer with a weight-average molecular weight of approximately 45,000 and an acid value of 155 mgKOH/g (45 mass % solid) (A5) was obtained in the same manner as (A1).

TABLE 1

|  |  | Content (parts by mass) | | | | |
| --- | --- | --- | --- | --- | --- | --- |
|  |  | (A1) | (A2) | (A3) | (A4) | (A5) |
| (1) | Propyleneglycol monomethyl ether | 62 | 62 | 62 | 62 | 62 |
|  | Toluene | 62 | 62 | 62 | 62 | 62 |

TABLE 1-continued

|  |  | Content (parts by mass) | | | | |
|---|---|---|---|---|---|---|
|  |  | (A1) | (A2) | (A3) | (A4) | (A5) |
| (2) | Methacrylic acid | 12 | 17.5 | 24 | 30 | 24 |
|  | Methyl methacrylate | 58 | 52.5 | 43.5 | 35 | 46 |
|  | Ethyl acrylate | 30 | 30 | — | — | 30 |
|  | Butyl acrylate | — | — | 15 | — | — |
|  | Butyl methacrylate | — | — | 17.5 | 35 | — |
|  | 2,2′-Azobis(isobutyronitrile) | 1.5 | 1.2 | 2.5 | 1.8 | 1.8 |
| Weight-average molecular weight (Mw) | | 65,000 | 80,000 | 35,000 | 45,000 | 45,000 |
| Acid value (mgKOH/g) | | 78 | 115 | 156 | 195 | 155 |
| Tg (° C.) | | 60 | 65 | 65 | 85 | 71 |

The weight-average molecular weight (Mw) was measured by gel permeation chromatography (GPC), and calculation was performed using a standard polystyrene calibration curve. The GPC conditions were as follows.
GPC Conditions
Pump: Hitachi L-6000 (product name of Hitachi, Ltd.).
Column: Gelpack GL-R420, Gelpack GL-R430, Gelpack GL-R440 (all product names of Hitachi Chemical Co., Ltd.).
Eluent: Tetrahydrofuran
Measuring temperature: 40° C.
Flow rate: 2.05 mL/min
Detector: Hitachi L-3300 RI (product name of Hitachi, Ltd.).

[Acid Value Measuring Method]
The acid value was measured in the following manner. First, a binder polymer solution was heated at 130° C. for 1 hour to remove the volatile components and obtain a solid portion. After then precisely weighing out 1 g of polymer whose acid value was to be measured, the weighed out polymer was placed in an Erlenmeyer flask and 30 g of acetone was added to the polymer to form a homogeneous solution. Next, an appropriate amount of phenolphthalein was added to the solution as an indicator, and a 0.1N KOH aqueous solution was used for titration. The acid value was then calculated by the following formula.

Acid value=$0.1 \times Vf \times 56.1/(Wp \times I/100)$

In the formula, Vf represents the titer (mL) of the KOH aqueous solution, Wp represents the weight (g) of the measured resin solution, and I represents the ratio (mass %) of nonvolatile components in the measured resin solution.

Example 1

[Preparation of Coating Solution (V-1) Containing Photosensitive Resin Composition]
The materials listed in Table 2 were mixed for 15 minutes using a stirrer, to prepare a coating solution (V-1) containing a photosensitive resin composition for formation of a protective coat.

TABLE 2

|  |  | Example | | | | |
|---|---|---|---|---|---|---|
|  |  | 1 | 2 | 3 | 4 | 5 |
| Component (A) | (A1) | 55*1 | 55*1 | 55*1 | — | — |
| Other binder polymer | (A2) | — | — | — | 55*1 | 55*1 |
|  | (A3) | — | — | — | — | — |
|  | (A4) | — | — | — | — | — |
|  | (A5) | — | — | — | — | — |

TABLE 2-continued

|  |  | Example | | | | |
|---|---|---|---|---|---|---|
|  |  | 1 | 2 | 3 | 4 | 5 |
| Component (B) | A-TMMT | 45 | 45 | — | — | — |
|  | TMPTA | — | — | — | — | — |
|  | RP-1040 | — | — | 45 | — | — |
|  | DPHA | — | — | — | 45 | 45 |
| Other photopolymerizable compound | BPE-500 | — | — | — | — | — |
|  | 9G | — | — | — | — | — |
|  | UA-11 | — | — | — | — | — |
| Component (C) | IRGACURE OXE 01 | 3 | 5 | 3 | 3 | 3 |
|  | LUCIRIN TPO | — | — | — | — | — |
| Component (D) | 1HT | — | — | 0.5 | — | — |
|  | MMT | — | — | — | — | — |
|  | HAT | — | — | — | — | 0.5 |
|  | 3MT | — | — | — | — | — |
|  | ATT | — | — | — | — | — |
|  | AMT | — | — | — | — | — |
|  | Antage W-500 | 0.1 | 0.1 | 0.1 | 0.1 | 0.1 |
| Other | Methyl ethyl ketone | 50 | 50 | 50 | 50 | 50 |

*1Indicates parts by mass of binder polymer after removal of solvent.

[Fabrication of Photosensitive Element (E-1)]
Using a polyethylene terephthalate film with a thickness of 50 μm as the support film, the coating solution (V-1) containing the photosensitive resin composition and solvent prepared above was uniformly coated onto the support film with a comma coater, and dried for 3 minutes at 100° C. with a hot air convection drier to remove the solvent, thereby forming a photosensitive layer comprising the photosensitive resin composition (photosensitive resin composition layer). The thickness of the obtained photosensitive layer was 5 μm.

Next, a 25 μm-thick polyethylene film was attached as a cover film on the obtained photosensitive layer, to fabricate a photosensitive element (E-1).

[Measurement of Protective Coat Transmittance]
While releasing the polyethylene film as the cover film of the obtained photosensitive element (E-1), a laminator (trade name HLM-3000 by Hitachi Chemical Ca, Ltd.) was used for lamination on a 1 mm-thick glass panel with the photosensitive layer in contact therewith, under conditions with a roll temperature of 120° C., a substrate feed rate of 1 in/min and a contact bonding pressure (cylinder pressure) of $4 \times 10^5$ Pa (because a substrate with a thickness of 1 mm and 10 cm length×10 cm width was used, the linear pressure at this time was $9.8 \times 10^3$ N/m), to form a stack with the photosensitive layer and support film laminated on the glass panel.

Next, a parallel ray exposure device (EXM1201 by Orc Manufacturing Co., Ltd.) was used to expose the photosensitive layer of the obtained stack to ultraviolet rays with an exposure dose of $5\times10^2$ J/m$^2$ (measured value for i-rays (wavelength of 365 nm)) from the photosensitive layer side, and then the support film was removed to obtain a transmittance measuring sample having a protective coat composed of a cured film of a photosensitive layer with a thickness of 5.0 μm.

Next, the visible light transmittance of the obtained sample at a measuring wavelength range of 400 to 700 nm was measured using an ultraviolet and visible spectrophotometer (U-3310) by Hitachi, Ltd. The transmittance of the obtained protective coat at a wavelength of 400 nm was 97% at a wavelength of 700 nm, 96% at a wavelength of 550 nm and 94% at a wavelength of 400 nm, and the minimum transmittance at 400 to 700 nm was 94%, and therefore satisfactory transmittance was ensured.

[Measurement of b* Value of Protective Coat]

While releasing the polyethylene film of the obtained photosensitive element (E-1), a laminator (trade name HLM-3000 by Hitachi Chemical Co., Ltd.) was used for lamination on a 0.7 mm-thick glass panel with the photosensitive layer in contact therewith, under conditions with a roll temperature of 120° C., a substrate feed rate of 1 m/min and a contact bonding pressure (cylinder pressure) of $4\times10^5$ Pa (because a substrate with a thickness of 1 mm and 10 cm length×10 cm width was used, the linear pressure at this time was $9.8\times10^3$ N/m), to form a substrate with the photosensitive layer and support film laminated on the glass panel.

Next, a parallel ray exposure device (EXM1201 by Orc Manufacturing Co., Ltd.) was used to expose the obtained photosensitive layer to ultraviolet rays with an exposure dose of $5\times10^2$ J/m$^2$ (measured value for i-rays (wavelength of 365 nm)) from the photosensitive layer side, and then the support film was removed and ultraviolet rays were further irradiated at an exposure dose of $1\times10^4$ J/m$^2$ (measured value for i-rays (wavelength of 365 nm)) from the photosensitive layer side, to obtain a b* value measuring sample having a protective coat composed of a cured film of the photosensitive layer with a thickness of 5.0 μm.

The obtained sample was then used for measurement of the b* value based on the CIELAB color system, using a spectrocolorimeter (CM-5) by Konica Minolta Holdings, Inc., with the light source set to D65 and the viewing angle to 2°.

The b* value of the protective coat was 0.44, thus confirming that it had a satisfactory b* value.

[Protective Coat Salt Spray Test (Synthetic Sweat Resistance Evaluation Test)]

While releasing the polyethylene film as the cover film of the obtained photosensitive element (E-1), a laminator (trade name HLM-3000 by Hitachi Chemical Co., Ltd.) was used for lamination on a sputtered copper-covered polyimide film (product of Toray Advanced Film Co., Ltd.) with the photosensitive layer in contact therewith, under conditions with a roll temperature of 120° C., a substrate feed rate of 1 in/min and a contact bonding pressure (cylinder pressure) of $4\times10^5$ Pa (because a substrate with a thickness of 1 mm and 10 cm length×10 cm width was used, the linear pressure at this time was $9.8\times10^3$ N/m), to form a stack with the photosensitive layer and support film laminated on the sputtered copper.

Next, a parallel ray exposure device (EXM1201 by Orc Manufacturing Co., Ltd.) was used to expose the photosensitive layer of the obtained stack to ultraviolet rays with an exposure dose of $5\times10^2$ J/m$^2$ (measured value for i-rays (wavelength of 365 nm)) from the photosensitive side, and then the support film was removed and ultraviolet rays were further irradiated at an exposure dose of $1\times10^4$ J/m$^2$ (measured value for i-rays (wavelength of 365 nm)) from the photosensitive layer side, to obtain a synthetic sweat resistance evaluation sample having a protective coat composed of a cured film of the photosensitive layer with a thickness of 5.0 μm.

Next, using a salt water spray tester (STP-90V2 by Suga Test Instruments Co., Ltd.) according to JIS (Z 2371), the sample was mounted in the test chamber and salt water (pH=6.7) at a concentration of 50 g/L was sprayed for 48 hours at a test chamber temperature of 35° C. and a spraying volume of 1.5 mL/h. Upon completion of spraying, the salt water was wiped off and the surface condition of the evaluation sample was observed for evaluation on the following scale.

A: Absolutely no change in protective coat surface.
B: Very slight traces on protective coat surface, but no change in copper.
C: Traces on protective coat surface, but no change in copper.
D: Traces on protective coat surface, and discoloration of copper.

Based on observation of the surface condition of the evaluation sample, an evaluation of "B" was assigned, i.e. very slight traces on the protective coat surface and no change in copper.

[Development Residue Test of Photosensitive Layer]

While releasing the polyethylene film as the cover film of the obtained photosensitive element, a laminator (trade name FILM-3000 by Hitachi Chemical Co., Ltd.) was used for lamination on a sputtered copper-covered polyimide film (product of Toray Advanced Film Co., Ltd.) with the photosensitive layer in contact therewith, under conditions with a roll temperature of 120° C., a substrate feed rate of 1 m/min and a contact bonding pressure (cylinder pressure) of $4\times10^5$ Pa (because a substrate with a thickness of 1 mm and 10 cm length×10 cm width was used, the linear pressure at this time was $9.8\times10^3$ N/m), to form a stack with the photosensitive layer and support film laminated on the sputtered copper.

After forming the stack and storing it for 24 hours under conditions of 23° C., 60%, a photomask was set on the support film, the photomask having lines/spaces of 300 μm/300 μm, with alternate patterning of active light ray transparent sections and active light ray shielding sections, and a parallel ray exposure device (EXM1201 by Orc Manufacturing Co., Ltd.) was used for image irradiation of ultraviolet rays at an exposure dose of $5\times10^2$ J/m$^2$ (measured value for i-rays (wavelength of 365 nm)) from the direction normal to the photomask.

Next, the support film laminated on the photosensitive layer was removed and 1.0 mass % aqueous sodium carbonate was used for spray development at 30° C. for 40 seconds, to selectively remove the photosensitive layer and form a protective coat pattern. The base material surface condition was observed with a microscope at the sections of the obtained protective coat pattern-formed substrate where the photosensitive layer had been selectively removed, and the development residue was evaluated on the following scale.

A: Absolutely no change in base material surface.
B: Slight discoloration of copper on base material surface, but no development residue.
C: Slight discoloration of copper on base material surface, and slight generation of development residue.

D: Generation of development residue.
Observation of the surface condition of the evaluation sample revealed slight discoloration of copper on the base material surface and slight generation of development residue, and an evaluation of C was assigned.

[Crosscut Adhesiveness Test of Protective Coat]

While releasing the polyethylene film as the cover film of the obtained photosensitive element, a laminator (trade name HLM-3000 by Hitachi Chemical Co., Ltd.) was used for lamination on a sputtered copper-covered polyimide film (product of Toray Advanced Film Co., Ltd.) with the photosensitive layer in contact therewith, under conditions with a roll temperature of 120° C., a substrate feed rate of 1 m/min and a contact bonding pressure (cylinder pressure) of $4 \times 10^5$ Pa (because a substrate with a thickness of 1 mm and 10 cm length×10 cm width was used, the linear pressure at this time was $9.8 \times 10^3$ N/m), to form a stack with the photosensitive layer and support film laminated on the sputtered copper.

Next, a parallel ray exposure device (EXM1201 by Orc Manufacturing Co., Ltd.) was used to expose the photosensitive layer of the obtained stack to ultraviolet rays with an exposure dose of $5 \times 10^2$ J/m$^2$ (measured value for i-rays (wavelength of 365 nm)) from the photosensitive layer side, and then the support film was removed and ultraviolet rays were further irradiated at an exposure dose of $1 \times 10^4$ J/m$^2$ (measured value for i-rays (wavelength of 365 nm)) from the photosensitive layer side, to obtain a crosscut adhesiveness test sample having a protective coat composed of a cured film of the photosensitive layer with a thickness of 5.0 μm.

Next, a 100-unit cross-cut test was conducted according to JIS (K5400), A cutter knife was used to form 1×1 mm square grid notches on the test surface, Mending Tape #810 (product of 3M Co.) was firmly contact bonded onto the grid section and the tape edge was slowly peeled off at an angle of 0°, after which the state of the grid was observed and the crosscut adhesiveness was evaluated on the following scale.

A: Bonding on essentially 100% of total area.
B: Bonding remaining on 95% or greater and less than 100% of total area.
B-C: Bonding remaining on 85% or greater and less than 95% of total area.
C: Bonding remaining on 65% or greater and less than 85% of total area.
C-D: Bonding remaining on 35% or greater and less than 65% of total area.
D: Bonding remaining on 0% or greater and less than 35% of, total area. Upon observing the state of the grid of the evaluation sample, an evaluation of "B" was assigned, i.e. a state with bonding remaining on at least 95% of the total area of the sputtered copper.

Examples 2 to 12

A photosensitive element was fabricated in the same manner as Example 1, except for using solutions containing the photosensitive resin compositions and solvents listed in Tables 3 and 4 (the numerical units in the tables are parts by mass), and transmittance measurement, salt water spray testing, development residue testing and crosscut adhesiveness testing were carried out. As shown in Table 5, Examples 1 to 12 had satisfactory results for transmittance measurement, salt water spray resistance evaluation and crosscut adhesiveness.

TABLE 3

| | | Example | | | | |
|---|---|---|---|---|---|---|
| | | 6 | 7 | 8 | 9 | 10 |
| Component (A) | (A1) | — | 55*[1] | 55*[1] | 55*[1] | 55*[1] |
| | (A2) | 55*[1] | — | — | — | — |
| Other binder polymer | (A3) | — | — | — | — | — |
| | (A4) | — | — | — | — | — |
| | (A5) | — | — | — | — | — |
| Component (B) | A-TMMT | — | — | — | — | — |
| | TMPTA | — | — | 45 | 45 | — |
| | RP-1040 | — | — | — | — | — |
| | DPHA | 45 | 45 | — | — | 45 |
| Other photopoly-merizable compound | BPE-500 | — | — | — | — | — |
| | 9G | — | — | — | — | — |
| | UA-11 | — | — | — | — | — |
| Component (C) | IGRACURE OXE 01 | 3 | 3 | 3 | 3 | — |
| | LUCIRIN TPO | — | — | — | — | 5 |
| Component (D) | 1HT | — | — | — | — | — |
| | MMT | — | — | — | — | — |
| | HAT | — | — | — | — | — |
| | 3MT | 0.5 | — | — | — | — |
| | ATT | — | 0.5 | — | — | — |
| | AMT | — | — | 0.5 | — | — |
| Other | Antage W-500 | 0.1 | 0.1 | 0.1 | 0.1 | 0.1 |
| | Methyl ethyl ketone | 50 | 50 | 50 | 50 | 50 |

*[1]Indicates parts by mass of binder polymer after removal of solvent.

TABLE 4

| | | Example | |
|---|---|---|---|
| | | 11 | 12 |
| Component (A) | (A1) | 55*[1] | 55*[1] |
| | (A2) | — | — |
| Other binder polymer | (A3) | — | — |
| | (A4) | — | — |
| | (A5) | — | — |
| Component (B) | A-TMMT | — | 30 |
| | TMPTA | — | — |
| | RP-1040 | — | — |
| | DPHA | 45 | — |
| Other photopoly-merizable compound | BPE-500 | — | 15 |
| | 9G | — | — |
| | UA-11 | — | — |
| Component (C) | IRGACURE OXE 01 | — | 3 |
| | LUCIRIN TPO | 5 | — |
| Component (D) | IHT | — | — |
| | MMT | — | — |
| | HAT | 0.5 | — |
| | 3MT | — | — |
| | ATT | — | — |
| | AMT | — | — |
| Other | Antage W-500 | 0.1 | 0.1 |
| | Methyl ethyl ketone | 50 | 50 |

*[1]Indicates parts by mass of binder polymer after removal of solvent.

TABLE 5

| | | Example 1 | Example 2 | Example 3 | Example 4 | Example 5 | Example 6 | Example 7 | Example 8 | Example 9 | Example 10 | Example 11 | Example 12 |
|---|---|---|---|---|---|---|---|---|---|---|---|---|---|
| Transmittance (%) | 700 nm | 97 | 97 | 97 | 97 | 97 | 97 | 97 | 97 | 97 | 97 | 97 | 97 |
| | 550 nm | 96 | 96 | 96 | 96 | 95 | 96 | 96 | 96 | 96 | 96 | 96 | 96 |
| | 400 nm | 94 | 93 | 94 | 94 | 93 | 93 | 94 | 94 | 94 | 95 | 95 | 94 |
| Minimum transmittance at 400-700 nm (%) | | 94 | 93 | 94 | 94 | 93 | 93 | 94 | 94 | 94 | 95 | 95 | 94 |
| b* | | 0.44 | 0.67 | 0.42 | 0.39 | 0.45 | 0.43 | 0.40 | 0.44 | 0.44 | 0.22 | 0.23 | 0.41 |
| Salt spray test | | B | B | B | B-C | B | A | B | A | B | B-C | B | B-C |
| Development residue | | C | C | C-D | A | A | C | A | B-C | C-D | B | A | B |
| Cross-cut adhesion | | B | B | A | A | B | A | A | B | A | A | A | A |

Comparative Examples 1 to 8

A photosensitive element was fabricated in the same manner as Example 1, except for using solutions containing the photosensitive resin compositions and solvents listed in Tables 6 and 7 (the numerical units in the tables are parts by mass), and transmittance measurement, b* value measurement, salt water spray testing, development residue testing and crosscut adhesiveness testing were carried out.

TABLE 6

| | | Comparative Example | | | | |
|---|---|---|---|---|---|---|
| | | 1 | 2 | 3 | 4 | 5 |
| Component (A) | (A1) | — | — | — | — | 55*1 |
| | (A2) | — | — | — | — | — |
| Other binder polymer | (A3) | 55*1 | — | — | — | — |
| | (A4) | — | 55*1 | — | — | — |
| | (A5) | — | — | 55*1 | 55*1 | — |
| Component (B) | A-TMMT | 45 | — | — | — | — |
| | TMPTA | — | 45 | — | — | — |
| | RP-1040 | — | — | 45 | — | — |
| | DPHA | — | — | — | 45 | — |
| Other photopolymerizable compound | BPE-500 | — | — | — | — | 45 |
| | 9G | — | — | — | — | — |
| | UA-11 | — | — | — | — | — |
| Component (C) | IRGACURE OXE 01 | 3 | 3 | 3 | 3 | — |
| | IRGACURE 369 | — | — | — | — | 5 |
| Component (D) | 1HT | — | 0.5 | 0.5 | — | — |
| | MMT | — | — | — | 0.5 | 0.5 |
| | HAT | — | — | — | — | — |
| | 3MT | — | — | — | — | — |
| | ATT | — | — | — | — | — |
| | AMT | — | — | — | — | — |
| Other | Antage W-500 | 0.1 | 0.1 | 0.1 | 0.1 | 0.1 |

TABLE 6-continued

| | | Comparative Example | | | | |
|---|---|---|---|---|---|---|
| | | 1 | 2 | 3 | 4 | 5 |
| | Methyl ethyl ketone | 50 | 50 | 50 | 50 | 50 |

*1Indicates parts by mass of binder polymer after removal of solvent.

TABLE 7

| | | Comp. Ex. | | |
|---|---|---|---|---|
| | | 6 | 7 | 8 |
| Component (A) | (A1) | — | — | 55*1 |
| | (A2) | 55*1 | 50*1 | — |
| Other binder polymer | (A3) | — | — | — |
| | (A4) | — | — | — |
| | (A5) | — | — | — |
| Component (B) | A-TMMT | — | — | — |
| | TMPTA | — | — | — |
| | RP-1040 | — | — | — |
| | DPHA | — | — | — |
| Other photopolymerizable compound | BPE-500 | — | — | — |
| | 9G | 45 | — | 30 |
| | UA-11 | — | 50 | 15 |
| Component (C) | IRGACURE OXE 01 | 3 | 3 | 3 |
| | IRGACURE 369 | — | — | — |
| Component (D) | IHT | — | — | — |
| | MMT | — | — | — |
| | HAT | 0.5 | — | — |
| | 3MT | — | 0.5 | 0.5 |
| | ATT | — | — | — |
| | AMT | — | — | — |
| Other | Antage W-500 | 0.1 | 0.1 | 0.1 |
| | Methyl ethyl ketone | 50 | 50 | 50 |

*1Indicates parts by mass of binder polymer after removal of solvent.

TABLE 8

| | | Comp. Ex. 1 | Comp. Ex. 2 | Comp. Ex. 3 | Comp. Ex. 4 | Comp. Ex. 5 | Comp. Ex. 6 | Comp. Ex 7 | Comp. Ex. 8 |
|---|---|---|---|---|---|---|---|---|---|
| Transmittance (%) | 700 nm | 96 | 96 | 97 | 97 | 95 | 97 | 97 | 97 |
| | 550 nm | 95 | 95 | 96 | 96 | 93 | 96 | 96 | 96 |
| | 400 nm | 93 | 93 | 94 | 94 | 91 | 94 | 94 | 94 |
| Minimum transmittance at 400-700 nm (%) | | 93 | 93 | 94 | 94 | 91 | 94 | 94 | 94 |
| b* | | 0.44 | 0.43 | 0.42 | 0.40 | 2.85 | 0.41 | 0.52 | 0.46 |
| Salt spray test | | C-D | D | C-D | C-D | D | D | D | C-D |
| Development residue | | B | A | A | A | A | A | A | C |
| Cross-cut adhesion | | B | A | B | B | A | B | A | A |

As shown in Table 8, Comparative Examples 1 and 2 which used binder polymers (A3) and (A4) had inferior results for salt water spray resistance (synthetic sweat resistance). The results for salt water spray resistance were also inferior in Comparative Examples 3 to 6 which used ethoxylated bisphenol A dimethacrylate (BPE-500, product of Shin-Nakamura Chemical Co., Ltd.), polyethyleneglycol #400 dimethacrylate (9G, product of Shin-Nakamura Chemical Co., Ltd.) and urethane diacrylate (UA-11, product of Shin-Nakamura Chemical Co., Ltd.) as photopolymerizable compounds.

The symbols for the components in Tables 2 to 4, Table 6 and Table 7 have the following meanings.

Component (A)

(A1): Propyleneglycol monomethyl ether/toluene solution of copolymer with monomer mixing ratio of (methacrylic acid/methyl methacrylate/ethyl acrylate=12/58/30 (mass ratio)), weight-average molecular weight: 65,000, acid value: 78 mgKOH/g (A2): Propyleneglycol monomethyl ether/toluene solution of copolymer with monomer mixing ratio of (methacrylic acid/methyl methacrylate/ethyl acrylate=17.5/52.5/30 (mass ratio)), weight-average molecular weight: 80,000, acid value: 115 mgKOH/g Other Binder Polymers (A3): Propyleneglycol monomethyl ether/toluene solution of copolymer with monomer mixing ratio of (methacrylic acid/methyl methacrylate/butyl acrylate/butyl methacrylate=24/43.5/15/17.5 (mass ratio)), weight-average molecular weight: 35,000, acid value: 156 mgKOH/g (A4): Propyleneglycol monomethyl ether/toluene solution of copolymer with monomer mixing ratio of (methacrylic acid/methyl methacrylate/butyl methacrylate=30/35/35 (mass ratio)), weight-average molecular weight: 45,000, acid value: 195 mgKOH/g (A5): Propyleneglycol monomethyl ether/toluene solution of copolymer with monomer mixing ratio of (methacrylic acid/methyl methacrylate/ethyl acrylate=24/46/30 (mass ratio)), weight-average molecular weight: 45,000, acid value: 155 mgKOH/g Component (B)

A-TMMT: Pentaerythritol tetraacrylate (product of Shin-Nakamura Chemical Co., Ltd.)

TMPTA: Trimethylolpropane triacrylate (product of Nippon Kayaku Co., Ltd.)

RP-1040: EO-modified pentaerythritol tetraacrylate (product of Nippon Kayaku Co., Ltd.)

DPHA: Dipentaerythritol hexaacrylate (product of Nippon Kayaku Co., Ltd.)

Other Photopolymerizable Compounds

BPE-500: Ethoxylated bisphenol A dimethacrylate (product of Shin-Nakamura Chemical Co., Ltd.)

9G: Polyethyleneglycol #400 dimethacrylate (product of Shin-Nakamura Chemical Co., Ltd.)

UA-11: Urethane diacrylate (product of Shin-Nakamura Chemical Co., Ltd.)

Component (C)

IRGACURE OXE 01: 1,2-Octanedione,1-[(4-phenylthio)phenyl-,2-(O-benzoyloxime)] (product of BASF)

IRGACURE 369: 2-Benzyl-2-dimethylamino-1-(4-morpholinophenyl)-butanone-1 (product of BASF)

LUCIRIN TPO: 2,4,6-Trimethylbenzoyl-diphenyl-phosphine oxide (product of BASF)

Component (D)

1HT: 1H-Tetrazole (product of Toyobo, Ltd.)

MMT: 1-Methyl-5-mercapto-1H-tetrazole (product of Toyobo, Ltd.)

HAT: 5-Amino-1H-tetrazole (product of Toyobo, Ltd.)

3MT: 3-Mercapto-triazole (product of Wako Pure Chemical Industries, Ltd.)

ATT: 2-Amino-5-mercapto-1,3,4-thiadiazole (product of Wako Pure Chemical Industries, Ltd.)

AMT: 3-Amino-5-mercaptotriazole (product of Wako Pure Chemical Industries, Ltd.)

Other Components

Antage W-500: 2,2'-Methylene-bis(4-ethyl-6-tert-butylphenol) (product of Kawaguchi Chemical Industry Co., Ltd.)

Methyl ethyl ketone: product of Tonen Chemical Co., Ltd.

Explanation of Symbols

1: Photosensitive element, 10: support film, 20: photosensitive layer, 22: protective coat, 30: protective film, 100: base material, 101: transparent base, 102: touch screen, 103: transparent electrode X-position coordinate), 104: transparent electrode (Y-position coordinate), 105: lead wiring, 106: connecting electrode, 107: connecting terminal, 110,120: electrodes for touch panel, 122,123: protective coats, 130: photomask, 200: touch panel.

The invention claimed is:

1. A method for forming a protective coat on an electrode for a touch panel, wherein a photosensitive layer comprising a photosensitive resin composition containing a binder polymer having a carboxyl group and an acid value of 30 to 120 mgKOH/g, a photopolymerizable compound having at least three ethylenic unsaturated groups, a photopolymerization initiator, and one or more compounds selected from the group consisting of benzotriazole, 1H-benzotriazole-1-acetonitrile, benzotriazole-5-carboxylic acid, 1H-benzotriazole-1-methanol, carboxybenzotriazole, triazole compounds containing mercapto groups, triazole compounds containing amino groups, thiadiazole compounds and tetrazole compounds is formed on a base material having an electrode for a touch panel, prescribed sections of the photosensitive layer are cured by irradiation with active light rays and then the sections other than the prescribed sections are removed, to form a protective coat comprising the cured sections of the photosensitive layer covering all or a portion of the electrode.

2. The method for forming a protective coat on an electrode for a touch panel according to claim 1, wherein the photopolymerizable compound includes at least one compound selected from the group consisting of (meth)acrylate compounds having a pentaerythritol-derived backbone, (meth)acrylate compounds having a dipentaerythritol-derived backbone, (meth)acrylate compounds having a trimethylolpropane-derived backbone and (meth)acrylate compounds having a glycerin-derived backbone.

3. The method for forming a protective coat on an electrode for a touch panel according to claim 1, wherein the photosensitive layer has a minimum visible light transmittance of 90% or greater at 400 to 700 nm.

4. The method for forming a protective coat on an electrode for a touch panel according to claim 1, wherein the photosensitive layer has a b* value of −0.2 to 1.0 based on the CIELAB color system.

5. The method for forming a protective coat on an electrode for a touch panel according to claim 1, wherein the photopolymerization initiator contains an oxime ester compound and/or a phosphine oxide compound.

6. The method for forming a protective coat on an electrode for a touch panel according to claim 1, wherein a photosensitive element is prepared comprising a support film and a photosensitive layer composed of the photosensitive resin composition provided on the support film, and the photosensitive layer of the photosensitive element is transferred onto the base material to provide the photosensitive layer.

7. A method for manufacturing a touch panel comprising a step of forming, on a base material with an electrode for a touch panel, a protective coat covering all or a portion of the electrode by the method according to claim 1.

8. The method for forming a protective coat on an electrode for a touch panel according to claim 1, wherein the one or more compounds selected from the group consisting of bensotiazole, 1H-benzotriazole-1-acetonitrile, benzotriazole-5-carboxylic acid, 1H-benezotriazole-1-methanol, carboxybenzotriazole, triazole compounds containing mercapto groups, triazole compounds containing amino groups, thiadiazole compounds and tetrazole compounds comprises a tetrazole compound with an amino group.

9. The method for forming a protective coat on an electrode for a touch panel according to claim 1, wherein the one or more compounds selected from the group consisting of benzotriazole, 1H-benzotriazole-1-acetonitrile, benzotriazole-5-carboxylic acid, 1H-benzotriazole-1-methanol, carboxybenzotriazole, triazole compounds containing mercapto groups, triazole compounds containing amino groups, thiadiazole compounds and tetrazole compounds is selected from the group consisting of 1H-tetrazole, 5-amino-1H-tetrazole, 1-methyl-5-mercapto-1H-tetrazole, 3-Mercaptotriazole, 2-amino-5-mercapto-1,3,4-thiadiazole and 3-amino-5-mercaptotriazole.

10. The method for forming a protective coat on an electrode for a touch panel according to claim 1, wherein the one or more compounds selected from the group consisting of benzotriazole, 1H-benzotriazole-1-acetonitrile, benzotriazole-5-carboxylic acid, 1H-benzotriazole-1-methanol, caboxybenzotriazole, triazole compounds containing mercapto groups, triazole compounds containing amino groups, thiadiazole compounds and tetrazole compounds is selected from the group consisting of 1H-tetrazole, 5-amino-1H-tetrazole and 1-methyl-5-mercapto-1H-tetrazole.

11. The method for forming a protective coat on an electrode for a touch panel according to claim 1, wherein a content of the one or more compounds selected from the group consisting of benzotriazole, 1H-benzotriazole-1-acetonitrile, benzotriazole-5-carboxylic acid, 1H-benzotriazole-1-methanol, carboxybenzotriazole, triazole compounds containing mercapto groups, triazole compounds containing amino groups, thiadiazole compounds and tetrazole compounds in the photosensitive resin composition is 0.05 to 10.0 parts by mass with respect to 100 parts by mass as the total of the binder polymer having a carboxyl group and an acid value of 30 to 120 mgKOH/g and the photopolymerizable compound having at least three ethylenic unsaturated groups.

12. The method for forming a protective coat on an electrode for a touch panel according to claim 1, wherein the molecular weight of the binder polymer is 30,000 to 150,000.

13. The method for forming a protective coat on an electrode for a touch panel according to claim 1, wherein a post-drying thickness of the photosensitive layer formed on the base material having the electrode for a touch panel is 10 µm or smaller.

* * * * *